United States Patent [19]
Steensgaard-Madsen

[11] Patent Number: 5,982,317
[45] Date of Patent: Nov. 9, 1999

[54] OVERSAMPLED DIGITAL-TO-ANALOG CONVERTER BASED ON NONLINEAR SEPARATION AND LINEAR RECOMBINATION

[75] Inventor: Jesper Steensgaard-Madsen, 426 NW. 15$^{th}$ St. #1, Corvallis, Oreg. 97330

[73] Assignee: Jesper Steensgaard-Madsen, Hoejby Sjaelland, Denmark

[21] Appl. No.: 09/061,671

[22] Filed: Apr. 16, 1998

Related U.S. Application Data

[60] Provisional application No. 60/044,665, Apr. 18, 1997.

[51] Int. Cl.$^6$ ....................................................... H03M 3/00
[52] U.S. Cl. ............................................ 341/143; 341/144
[58] Field of Search ................................. 341/118, 143, 341/120, 144

[56] References Cited

U.S. PATENT DOCUMENTS

| | | |
|---|---|---|
| 5,138,317 | 8/1992 | Story . |
| 5,221,926 | 6/1993 | Jackson . |
| 5,369,403 | 11/1994 | Temes et al. . |
| 5,404,142 | 4/1995 | Adams et al. . |
| 5,406,283 | 4/1995 | Leung ....................................... 341/143 |
| 5,434,739 | 7/1995 | Norsworthy et al. .................... 341/143 |
| 5,648,779 | 7/1997 | Cabler ...................................... 341/143 |
| 5,724,038 | 3/1998 | Koifman et al. .......................... 341/144 |

OTHER PUBLICATIONS

"Delta–Sigma ADCs with Multibit Internal Converters," *Delta–Sigma Data Convertors; Theory, Design, and Simulation*, IEEE Press (1996), pp. 244–281.

"Linearity Enhancement of Multibit Delta–Sigma A/D and D/A Converters Using Data Weighted Averaging." *IEEE Transactions on Circuits and Systems–II: Analog And Digital Signal Processing*, vol. 42, No. 12 (1995), pp. 753–762.

"A Noise–Shaping Coder Topology for 15+ Bit Converters," *IEEE Journal of Solid–State Circuits*, vol. 24, No. 2 (1989), pp. 267–273.

"Multibit Sigma–Delta A/D Converter Incorporating A Novel Class of Dynamic Element Matching Techniques," *IEEE Transactions on Circuits and Systems–II: Analog and Digital Signal Processing*, vol. 39, No. 1 (1992), pp. 35–51.

"Noise–Shaping D/A Converters for Delta–Sigma Modulation." *IEEE International Symposium on Circuits and Systems* (1996), pp. 441–444.

"Noise–shaped multibit D/A convertor employing unit elements," *IEEE Electronic Letters*, vol. 31, No. 20 (1995), pp. 1712–1713.

"A 113dB SNR Oversampling DAC with Segmented Noise–Shaped Scrambling," 1998 *IEEE International Solid–State Circuits Conference.*

*Primary Examiner*—Howard L. Williams
*Attorney, Agent, or Firm*—Klarquist Sparkman Campbell Leigh & Whinston

[57] ABSTRACT

A error-shaping digital-to-analog (D/A) converter system [100], consisting of a separator [102], a set of D/A converters [104] [108], a set of optional analog filters [106] [108], a summation device [112], and an optional analog filter [114]. The separator [102] separates the digital input signal into a set of low-resolution signals of which only one has significant power in the system's signal band. These signals are D/A converted by mismatch-shaping D/A converters [104] [108], in some embodiments filtered by analog filters [106] [108], and then added by the summing device [112]. Imperfections of the employed D/A converters [104] [108] will only cause very small errors in the signal band, such errors being essentially uncorrelated to the digital input signal. The D/A converter system is comparable to a scaled-element D/A converter in which the distortion is transformed into a noise component having very little power in the signal band.

41 Claims, 12 Drawing Sheets

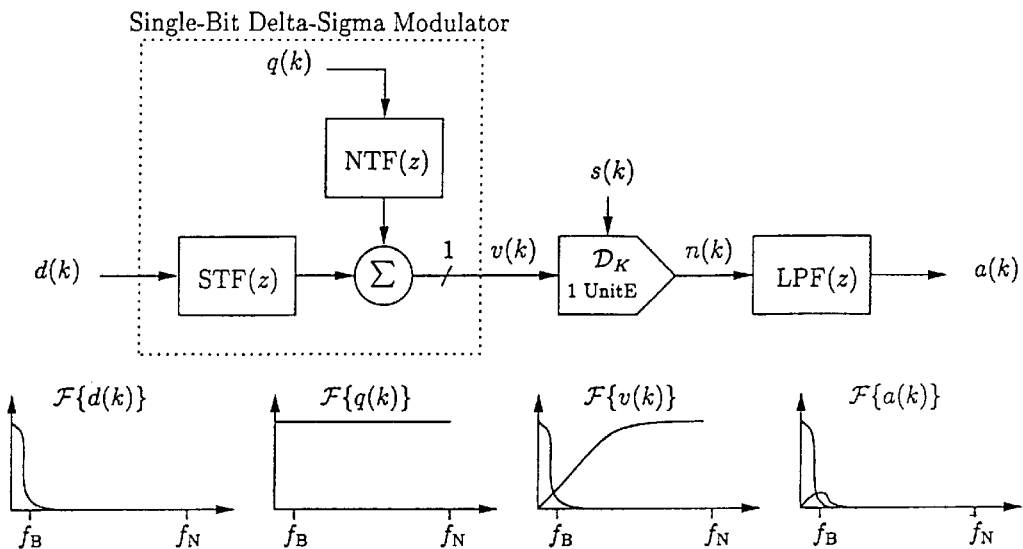
Figure 4 PRIOR ART
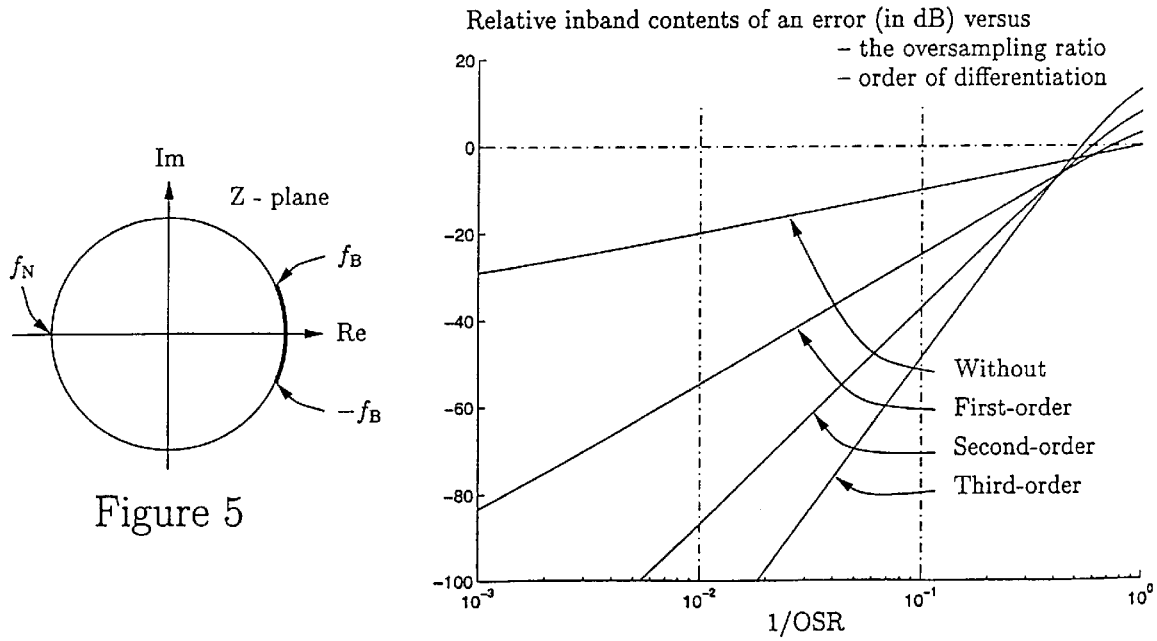
Figure 5
Figure 6

OVERSAMPLED DIGITAL-TO-ANALOG CONVERTER BASED ON NONLINEAR SEPARATION AND LINEAR RECOMBINATION

RELATED APPLICATION DATA

This application is based on and claims priority from U.S. Provisional Patent Application No. 60/044,665, filed Apr. 18, 1997.

BACKGROUND: FIELD OF INVENTION

The field of invention is data conversion, more precisely, this invention relates to oversampled mismatch-shaping digital-to-analog (D/A) data converters.

BACKGROUND: DESCRIPTION OF PRIOR ART

To assure that the following description and discussion can be as exact as possible, D/A conversion will first be defined. Some terminology will also be defined. Based on these definitions, the advantages and shortcomings of some prior-art D/A converters are discussed.

Definition of Digital-to-Analog Conversion

A D/A converter is a system which controls a physical phenomenon (the analog output) according to a digital input signal.

The digital input signal will at any time be represented by codes $D_i$ representing numbers $d_i$. The set of numbers $\cup_i d_i$, which can be represented, may be chosen arbitrarily; they do not necessarily have to be integers, uniformly spaced, nor monotonic with respect to the index i.

The physical phenomenon, which the D/A converter controls, can be almost anything; it will often be a voltage, a current, a charge, a frequency, or a light intensity. This controlled physical phenomenon is, by an actual or a fictive measurement, mapped to a real-number-valued variable a. The physical phenomenon is typically characterized by its measure a. The output of a D/A converter is thereby an "analog signal-carrying variable." A typical example is a D/A converter which controls the voltage between two nodes; the output variable a is in that case "the output voltage."

The combination, that a is evaluated on a piecewise continuous scale and that it can be measured only at one physical location, makes it an "analog" signal. Digital signals, on the contrary, will have values from a finite set of possible values. In most implementations, digital signals are represented by a set of low-resolution signals; the bits in a digital data bus is an example.

To aid the understanding of the following discussion, all digital signals will be referred to by their values $d_i$ rather than the codes $D_i$ representing such values. From this point of view, a D/A converter can be thought of as a system that implements a function D mapping the input variable d to the output variable a. An ideal D/A converter can thereby be characterized by:

$$a = D(d) = K \cdot d$$

K, the D/A converter's gain factor, is a dimensional constant which fully characterizes the operation of an ideal D/A converter.

Many D/A converters are realized using a set of differently scaled D/A converters which in combination perform the D/A conversion. To facilitate a compact and clear description of such D/A converters, the gain factor K of each converter will be used as an index to D. For example:

$$a = D_{10}(d) = 10 \cdot d$$

Definition of the Error Signal

All implementations of D/A converters are associated with some non-idealities. Non-idealities can be modeled by adding an error signal e to the ideal output:

$$a = K \cdot d + e = V_K(d) + e$$

In the general case, the error signal e will include both stochastic and deterministic errors. Stochastic errors are often referred to as "circuit noise," an issue which will not be addressed in the following discussion. It will be assumed that all employed components are time-invariant; this implies that all signals in the discussed systems will be deterministic (non-stochastic) functions of the input. For delta-sigma D/A converters, the function describing e will be highly nonlinear and depend not only upon the instantaneous value of the input signal d, but upon the whole signal d since a reset event has taken place. In the following, the term "noise" refers to the deterministic part of the error signal e which is not harmonic distortion nor intermodulation of the input d.

FIG. 1 shows the symbol which will be used in the drawings to illustrate a generic D/A converter.

Unit-Element D/A Converters

Unit-Element D/A converters are a very simple type of D/A converter. They require that the same analog signal (the unit element $a_{unit}$) can be realized in multiple copies $a_{unit:i}$. They also require that the unit elements can be accurately added in the analog domain.

The operation is straightforward. The ideal output must be expressible as an integer N times the ideal value of the unit element $a_{unit}$. The output a is generated as the sum of the first N unit elements: $a = a_{unit:1} + a_{unit:2} + \ldots + a_{unit:N}$. The unit elements $a_{unit:i}$ are ordered with respect to the index i, and the order is maintained throughout the period of operation. Addressing unit elements in this way is also known as "thermometer coding."

Unit-element D/A converters are not suitable for high-resolution purposes; the thermometer coding becomes complex. However, because absolute monotonicity and a low differential nonlinearity (DNL) can be assured, some medium-resolution unit-element D/A converters have been implemented. Techniques to ease the implementation of such converters are described in U.S. Pat. Nos. 5,539,405 and 5,600,319.

While unit-element D/A converters have a low DNL, their performance in terms of integral nonlinearity (INL) is only moderately good. Calibration techniques are required to obtain a total harmonic distortion (THD) of less than about −60 dB.

FIG. 2 shows the symbol which will be used in the drawings to illustrate a unit element D/A converter with N unit elements.

Scaled-Element D/A Converters

Medium-resolution medium-performance D/A converters are typically based on the number system in which the digital input d is coded.

Conventional Number Systems

The conventional number systems represent fractional numbers by ordered sets of digits. The represented number is a weighted sum of the digits representing it. Each digit's weight is determined by its position in the ordered set. For example, in the Arabic number system, the number 961.4 means 9 hundreds+6 tens+1 one+4 tenths.

A digital signal d, which is in the range 0–999.9 and has a step size of 0.1, can be represented by 4 digit signals: $d_{(2)}$, $d_{(1)}$, $d_{(0)}$, and $d_{(-1)}$. Each digit signal will at any given time have one value from the set {0,1,2,3,4,5,6,7,8,9}. The coding of each and all digit signals is uniquely defined by requiring the following equality to hold:

$$d = 10^2 d_{(2)} + 10^1 d_{(1)} + 10^0 d_{(0)} + 10^{-1} d_{(-1)}$$

Each digit signal has a non-linear relationship with d; however, d is a linear function of the digit signals representing it. The linearity implies that the D/A conversion can be performed by D/A converting each digit signal separately and subsequently summing the scaled analog digit signals in the analog domain. In electronic circuits, digital signals are usually coded in the binary number system. In that case, the weights of the digit signals are powers of 2 (as opposed to the powers of 10 which are used in the Arabic number system). Each digit signal will either have the value 0 or 1. The internal D/A converters, which are used to convert the digit signals, can therefore be implemented by a single element scaled proportional to the respective digit signal's weight.

An example of a binary-scaled-element D/A converter is shown in FIG. 3; it has a range from 0 to 15.5 with a step size of 0.5. According to the figure, the output-referred error signal can be calculated as:

$$e = 1 \cdot d - a = e_{(-1)} + e_{(0)} + e_{(1)} + e_{(2)} + e_{(3)}$$

The resolution can easily be increased, but the monotonicity will soon be lost. In other words, the DNL as well as the INL is poor.

Distortion

For unit-element and scaled-element D/A converters, it is easy to show that the error signal e depends only on the instantaneous value of the input d, not upon previous inputs. The error signal e can, therefore, be described as harmonic distortion and intermodulation of d.

To help understand the ensuing theoretical explanations, it is important to understand the following:

1. The distortion of unit-element and scaled-element D/A converters will depend on the absolute error of each element in the D/A converter relative to the sum of all the elements. The distortion of a D/A converter will, therefore, mainly depend on the relative error of its largest elements. The distortion of a D/A converter will in general not depend on its resolution (the number of levels which it can generate).

2. When evaluating a D/A converter's distortion, a linear trend may be removed from its input-output relation. Two-level D/A converters will therefore be inherently linear (the only exception to the just mentioned rule concerning resolution).

Harmonic distortion and intermodulation are error types to which many high-performance systems are sensitive. If a unit-element or scaled-element D/A converter is implemented in a mainstream CMOS or BiCMOS technology, the technology's matching properties will typically cause the THD to be in the order of −60 dB. That is not sufficient for high resolution purposes.

Delta-Sigma D/A Converters

Delta-sigma D/A converters offer an inherently monotonic conversion which, without relying on matching, is essentially free of harmonic distortion and intermodulation. Conceptually they are very different from the D/A converters discussed above.

Delta-sigma D/A converters are sampled systems. They do not convert each input sample separately. They convert the input signal as a whole and are therefore best described in the frequency domain; this technique which is a well-known to those skilled in the art. The Z-transformation will be denoted by Z{} and the Fast-Fourier-Transformation (FFT) will be denoted by F{}. As is common practice, a sampled signal, say x(k), may, without loss of information, be referred to by either its time-domain expression x(k) or its Z-transformed X(z). Notice that upper-case letters denote signals represented in the frequency domain, while lower-case letters denote signals represented in the time domain. The argument, z or k, will also indicate in which domain a signal is represented. Filters will be referred to by their transfer function H(z).

Basic Properties for Delta-Sigma D/A Converters

Delta-sigma D/A conversion is a tradeoff between resolution and speed. The frequency band of interest (which from now on will be called the signal band) of the input signal can only be a small fraction of the theoretically maximum bandwidth given by the Nyquist Theorem. The ratio of the Nyquist bandwidth $f_N$ (half the sampling frequency) and the bandwidth $f_B$ of the signal band is called the converter's over-sampling ratio (OSR):

$$OSR = \frac{f_N}{f_B} \gg 1$$

The operation of a delta-sigma D/A converter can be described as the combination of a nearly-ideal D/A converter followed by a low-pass filter with a narrow pass band.

As for any other D/A converter, the analog output signal a(k) will include an unwanted error signal e(k). An advantage of delta-sigma D/A converters is that e(k), besides being small, typically has properties similar to those of a noise signal; e(k) is not harmonic distortion nor intermodulation of d(k).

FIG. 4 shows a model of the operation of a traditional single-bit delta-sigma D/A converter. A digital delta-sigma modulator changes the high-resolution digital input d(k) into a single-bit digital signal v(k). Because v(k) is a single-bit signal, it can be D/A converted without introducing nonlinearities. The analog output a(k) is obtained by filtering of the output n(k) from the single-bit D/A converter.

Theory of Operation

The key in the system is the delta-sigma modulator. It is not obvious that it is possible to generate a single-bit signal v(k), such that a good estimate of d(k) can be obtained simply by filtering v(k). However, theory developed during the last few decades and numerous successful implementations have proved that it is indeed possible. An up-to-date description of how this can be done may be found in the book, *Delta-Sigma Data Converters; Theory, Design, and Simulation*, edited by Steven R. Norsworthy, Richard Schreier, and Gabor C. Temes, published by IEEE Press, 1996. Further references to this book will be by its title only.

Based on FIG. 4, the following discussion will provide insight into some fundamental properties of a delta-sigma D/A converter. Note that FIG. 4 does not attempt to illustrate how the modulator can be implemented; it merely models its signal conditioning operation.

Assuming that the two possible values of v(k) are ±1, the power of v(k) will be time-independent and equal to 1. Consequently, v(k) cannot track d(k) in power. Parseval's Theorem states that a signal's power is proportional to the integral of the square of the absolute value of its spectral components in the Nyquist band (from 0 to $f_N$). The delta-sigma modulator's job is to make the difference between v(k) and d(k) as small as possible in the signal band. Their difference in power will therefore have to be expressed as a difference in their spectral components outside the signal band (from $f_B$ to $f_N$ in FIG. 4). The qualitative properties of the spectral components of d(k), q(k), v(k), and a(k) are shown at the bottom of FIG. 4.

The internally generated signal q(k) is often called the "quantization noise." It is a deterministic signal, the sole cause of which is the low resolution of v(k). The modulator is designed such that the spectrum of q(k) has properties somewhat comparable to those of a white-noise signal. The modulator is said to be stable if q(k) remains bounded.

The transfer function NTF(z), by which q(k) is filtered before it is added to the signal path, is an inseparable part of the modulator. For well-designed modulators, NTF(z) will efficiently suppress the quantization noise in the signal band. The analog filter LPF(z) is intended to reject spectral components which are not in the signal band. All spectral components of q(k) will therefore be rejected by either NTF(z) or LPF(z). Leakage in the filter combination NTF(z)LPF(z) will degrade the converter's performance; the overall converter's error signal e(k) will be $D_K(q(k))$ filtered by NTF(z)LPF(z), plus s(k) filtered by LPF(z) (the latter part is just an offset).

The ideal output of a delta-sigma D/A converter is $D_K(d(k))$ filtered by the filter combination STF(z)LPF(z). Typically STF(z)LPF(z) will cause very little loss in the signal band.

Improving the Performance by Increasing the Order

The obtainable resolution of a delta-sigma D/A converter is determined by the power of q(k) and by the leakage in NTF(z)LPF(z).

To minimize the leakage of NTF(z)LPF(z) in the signal band, NTF(z) must have one or more zeros located close to all segments of the Z-plane unit circle which corresponds to the signal band; this part of the Z-plane is marked with a heavy arc in FIG. 5. There are essentially two ways to obtain this:

1. Make the base band narrow (high OSR) and place one or more zeros in the middle ($z=1+0j$).
2. If more than one zero is available, the leakage can be lowered by distributing the zeros in the base band. The leakage will still depend on the OSR; the higher the oversampling, the lower the leakage can be made.

The first solution is very simple, but it is typically not a good approach. The combination of the used technology and the system's power consumption limits $f_N$. Consequently, only applications with a narrow signal band can operate at a high OSR.

High-Order Modulators

If high resolution is required at a low OSR, the single-bit delta-sigma D/A modulator must be of high order (i.e. NTF(z) must have multiple zeros in the signal band). High-order single-bit delta-sigma modulators are, however, difficult to stabilize. Instability means that the magnitude of q(k) increases drastically, causing algorithmic overflow in the circuits, or otherwise poor system performance. Instability must be avoided, but the problem still is not fully solved. A design procedure is typically based on the trial-and-error principle. One rule of thumb, which gives a good starting point in the search for a good modulator, is to design NTF(z) as an Chebyshev-Passband high-pass filter with a peak gain of 1.6 or less.

The Output Filter

To obtain a good overall performance, q(k) must also be efficiently suppressed in the rest of the frequency spectrum. It is undesirable to design LPF(z) with a pass band which is significantly narrower than the stop band of NTF(z). In an optimum design, LPF(z) will have to be of at least the same order as the modulator. Since LPF(z) is an analog filter, it will unavoidably introduce errors, such as distortion, slew-rate effects, etc. Since the power of the signal n(k) at the input of the filter LPF(z) is constant, such errors will not scale with the signal level of the input d(k) as they would in a more traditional analog system. The circuit-level difficulties associated with the design of LPF(z) often constitute the bottleneck in high-order single-bit delta-sigma D/A converters.

Improving the Performance Using Internal Multibit Quantization

By reducing the power of q(k), a delta-sigma D/A converter's performance will obviously be improved. For well-designed systems, the only way to significantly reduce the power of q(k) is to increase the resolution of v(k). Such systems are called "multibit delta-sigma D/A converters." They have a number of advantages compared to their single-bit counterparts:

1. The power of q(k) is reduced. This implies that the OSR or the order of NTF(z) and LPF(z) can be reduced.
2. The modulator is significantly easier to stabilize; NTF(z) can be chosen more freely.
3. LPF(z) is easier to design because there is less noise to process.

These substantial advantages are quite obvious. Even so, systems have not been designed in this way until recently. The problem has centered around the D/A conversion of the multi-level signal v(k). For example, if a unit-element D/A converter is used for this purpose, s(k) will include harmonic distortion of v(k) and thereby harmonic distortion of d(k). Derivations show that the THD of a multibit delta-sigma D/A converter will be comparable to the THD of the D/A converter used internally in the signal path. The THD of a multibit system will therefore be in the order of −60 dB, unless excellent matching can be assured by calibration or other methods. Because any time-invariant two-level D/A converter is inherently linear, single-bit delta-sigma D/A conversion is a way to overcome the THD problem. Unfortunately, single-bit operation implies that a lot of shaped quantization noise will be included in the bit stream v(k).

Low-Resolution High-Linearity D/A Converters (LRHL-DACs)

Because multibit operation offers substantial system-level advantages, efforts have been made to design low-resolution high-linearity D/A converters (LRHL-DACs). In fact, increasing the resolution of v(k) from 2 to just 3 levels will have substantial advantages which can justify the implementation of a fairly complex internal D/A converter. Higher internal resolution will facilitate more system-level flexibility and improved performance, and hence more complex implementations of the internal D/A converter can be tolerated. U.S. Pat. Nos. 3,982,172; 4,125,803; 4,703,310; 4,791,406; 5,134,402; and 5,534,863 describe techniques to implement LRHL-DACs which may be used for this purpose. However useful, such techniques may not be the best ones to use.

Dynamic-Element-Matching D/A Converters

Instead of calibrating a low-resolution D/A converter to achieve high linearity (LRHL-DAC), it seems more promising to overcome element mismatch errors using dynamic element matching (DEM).

L. Richard Carley published a paper in the IEEE Journal of Solid-State Circuits, vol. 24, no.2, April 1989, describing a three-bit D/A converter, for use in sampled systems, for which the error signal s(k) is uncorrelated with its input signal v(k). It is a unit-element D/A converter which, as usual, sums as many elements as the input prescribes. However, which elements are used in the sum is randomly chosen for each input sample.

By doing so, the converter becomes perfectly linear. The D/A converter's gain factor is the average value of the elements, and s(k) will be a white-noise signal. The Nyquist-band power of s(k) is inversely proportional to the technology's matching properties. In a typical technology, the power of s(k) will be in the order of 60 dB below full scale. However, because the filter LPF(z) removes most of this noise before it reaches the output, the noise contents in a(k) is inversely proportional to the OSR. In FIG. 6, the upper curve, marked "Without," shows how much the noise will be suppressed as a function of the OSR. To achieve a signal-to-noise ratio (SNR) of 90 dB, the system must operate at an OSR in the order of 1000; this is a system constraint which is highly impractical. Nevertheless, the unit-element D/A converter using DEM is a historically important first example of a mismatch-shaping D/A converter.

As it was the case for delta-sigma D/A converters, a more efficient noise-shaping is required to make the concept commercially useful. As illustrated in FIG. 6, first- or second-order mismatch-shaping will be sufficient for nearly all purposes.

The following section describes low-resolution mismatch-shaping D/A converters which are suitable for use in multibit delta-sigma D/A converters.

Mismatch-Shaping D/A Converters

The gain of a unit-element D/A converter using DEM is the average value of the unit elements. A problem with DEM is that this effect can only be observed using long estimates based on a large number of samples—an effect which is directly related to the requirement of high over-sampling.

Individual Level Averaging

A solution on the next level of sophistication was described by Bosco H. Leung and Sehat Sutarja in IEEE's *Transactions on Circuits and Systems—II: Analog and Digital Signal Processing,* Vol. 39, No. 1, January 1992. They describe a mismatch-shaping algorithm which they call for Individual Level Averaging (ILA).

The ILA algorithm can be described using a 4-level unit element D/A converter as an example. Level 0 can only be generated by turning all 3 unit elements off. Level 1 can be generated in three ways—by separately turning on any one of the three elements. Level 2 can also be generated in three ways—by separately turning off any one of the three elements. Level 3 can only be generated by turning on all three elements. Consequently, the D/A converter must be in one of 8 states: 1 state for the input code being 0, 3 states for the input code being 1, 3 states for the input code being 2, and I state for the input code being 3. For each input code, the ILA algorithm keeps track of which combinations have been used in the past, and it always uses one of the combinations which so far has been used the least. Notice that the averaging is performed for each input code, therefore the name "Individual Level Averaging."

The advantage of the ILA algorithm, compared to the DEM algorithm, is that the averaging is perfect whenever all combinations have been used the same number of times. Assuming that this occurs frequently, even short-term estimates of the error signal will have a fairly small standard deviation from the value zero. The result is that the ILA algorithm can be used at a lower OSR than the DEM algorithm. The effect is verified by the simulation results presented in FIGS. 17 and 18 in the paper by Leung and Sutarja. These Figures clearly show that the D/A converter's error signal is shaped by a high-pass filter. Although useful, the ILA algorithm has some serious disadvantages:

The algorithm's complexity is high; the hardware requirement increases faster than proportionally with the number of unit elements.

If an input code is rarely used, the averaging, and thereby the error cancellation, will take more time and the requirement for over-sampling increases.

A successful implementation of the ILA algorithm (controlling 8 unit elements) was reported by Feng Chen and Bosco H. Leung in IEEE's *Journal of Solid-State Circuits,* Vol. 30, No. 4, April 1995.

Data Weighted Averaging

A family of algorithms, called Data Weighted Averaging (DWA), offers a more efficient mismatch shaping at a lower complexity. Examples are discussed by Michael J. Story in U.S. Pat. No. 5,138,317; by Baird and Fiez in the *Proceedings to IEEE's International Symposium on Circuits and Systems,* 1995, pp. 13–16; by Jackson in U.S. Pat. No. 5,221,926; and by Adams in U.S. Pat. No. 5,404,142.

The advantage of DWA algorithms, compared to the ILA algorithm, is that averaging occurs more frequently and they can therefore be used at lower over-sampling ratios. Also, DWA algorithms are typically significantly simpler to implement than the ILA algorithm. Mathematical analysis shows that the error signal from a DWA D/A converter is first-order shaped, i.e., a bounded error, which is filtered by $(1-z^{-1})$.

FIG. 6 shows how much mismatch errors will be suppressed in the signal band as a function of the OSR and the order of shaping. Notice that the power is relative to the relative matching performance of the technology in which the D/A converter is implemented (assumed to be −60 dB). Using a DWA algorithm, a 16-bit D/A converter, operated at about 30 times oversampling, can therefore be implemented in a mainstream technology without post-processing calibration.

The element rotation scheme (ERS) is an example of a DWA algorithm. The unit elements are thought distributed on an oriented circle (like the numbers on an analog clock), and used sequentially. Using the analog-clock analogy for a 12-unit-element D/A converter, the conversion of the sequence 9,5,5,6, . . . would cause the following elements to be turned on in the conversions (each row shows the elements used to convert one sample):

$\{a_{unit:1}, a_{unit:2}, a_{unit:3}, a_{unit:4}, a_{unit:5}, a_{unit:6}, a_{unit:7}, a_{unit:8}, a_{unit:9}\}$ $\{a_{unit:10}, a_{unit:11}, a_{unit:12}, a_{unit:1}, a_{unit:2}\}$ $\{a_{unit:3}, a_{unit:4}, a_{unit:5}, a_{unit:6}, a_{unit:7}\}$ $\{a_{unit:8}, a_{unit:9}, a_{unit:10}, a_{unit:11}, a_{unit:12}, a_{unit:1}\}$ etc.

By using ERS, it is assured that all the elements are used equally often; perfect averaging occurs every time a full cycle is completed. The algorithm is highly useful and its complexity is low enough for use in D/A converters with up to 5–6 bits of resolution.

Higher-Order Mismatch Shaping

If speed is of great concern, high-order mismatch shaping may be desired to minimize the OSR, thereby increasing the converter's bandwidth. For example, by increasing the mismatch shaping from first to second order, the OSR for a typical 16-bit converter can be reduced by a factor of approximately 3 (from 30 to 10); such an improvement is highly desirable.

It is possible to obtain at least second-order shaping of mismatch errors. The known algorithms are, however, quite complex to implement; each unit-element will typically require a delta-sigma modulator of its own. Papers that describe such algorithms include the following: "Noise-shaped multibit D/A converter employing unit elements" by R. Schreier and B. Zhang, published in *Electronics Letters*, Vol. 31, No. 20, 28th Sep., 1995; "Noise-Shaping D/A Converters for Delta-Sigma Modulation" by Ian Galton, published in Vol. 1 of *Proceedings to IEEE's International Symposium on Circuits and Systems*, 1996; "Noise Shaping Dynamic Element Matching Method Using Tree Structure" by A. Yasuda and H. Tanimoto, published in Electronics Letters, Vol. 33, No. 2, 16th Jan., 1997.

The Resolution of Mismatch-Shaping D/A Converters

Mismatch shaping is an effective way to improve a D/A converter's performance for narrow-band applications. However, by only addressing unit elements, the resolution will remain somewhat limited.

Resolution is the main problem; a unit-element mismatch-shaping D/A converter must be used in conjunction with a delta-sigma modulator and an analog filter LPF(z) to implement a high-resolution D/A converter. The hardware requirement to implement the known DWA algorithms is at least proportional to the number of unit elements. In other words, the algorithms' complexities are at least exponentially related to the resolution measured in number of bits. Fortunately, most algorithms are fairly simple to implement when the resolution is low.

The Symbol

FIG. 7 shows the symbol which will be used to represent a mismatch-shaping coder driving a N unit-element D/A converter—in combination, a mismatch-shaping D/A converter. The number in the oriented circle shows the order of mismatch shaping the coder performs.

Dual-Quantization Delta-Sigma Converters

An alternative approach is described by Gabor C. Temes and Shao-Feng Shu in U.S. Pat. No. 5,369,403. It preserves the single-bit characteristic of v(k) and thereby eliminates s(k) as a problem to be concerned about. The consequences of this design choice are well-known:

Large amounts of shaped quantization noise will be included in v(k).

The modulator, if it is of high order, will have to be stabilized by nonlinearities, such as saturation (also called hard-limiting or clipping) or reset of internal filter stages.

The Innovation

The dual-quantization topology is shown in FIG. 8. By introducing a noise-canceling path, the system compensates for the shaped quantization noise before it reaches the analog filter LPF(z). The main advantage is that the analog filter LPF(z) can be very simply implemented.

The Theory

By simple inspection, the following expression of the signal o(k) can be derived:

$$O(z) = K [D(z)STF(z) + Q(z)NTF(z)] + S(z)$$

As shown in FIG. 8, a compensation signal $P(z) = \hat{K} \cdot Q(z) \widehat{NTF}(z)$ is subtracted to eliminate the shaped quantization noise $K \cdot Q(z)NTF(z)$. The success of this scheme is based on the following assumptions:

That the quantization noise q(k) can be extracted from the system.

This can be obtained, for example by implementing the modulator as described in U.S. Pat. No. 5,369,403.

That q(k) can be filtered and D/A converted without introducing new errors.

Any multibit D/A conversion will be associated with the injection of an error signal. However, if q(k) is D/A converted before it is filtered by NTF(z), the error m(k), from the internal multibit D/A converter, will be efficiently suppressed in the system's signal band.

That the gains K and $\hat{K}$ of the two D/A converters match.

Analysis shows that this matching is not critical. If $\hat{K}$ matches K with a relative accuracy of, say, −50 dB, the shaped quantization noise will be reduced by 50 dB in the entire frequency spectrum. That is a major improvement.

That the analog replica $\widehat{NTF}(z)$ matches the modulator's noise transfer function NTF(z).

This is the problem. It has proven very difficult to fulfill this requirement to the required extent. This will be discussed below.

Matching of First-Order Filters

It is known that a nearly ideal matching of NTF(z) and its analog replica $\widehat{NTF}(z)$ can be obtained if the delta-sigma modulator is of first order: $NTF(z) = (1-z^{-1})$. This is illustrated in FIG. 4 in U.S. Pat. No. 5,369,403. It is also described in section 10.4 in the book, *Delta-Sigma Data Converters, Theory, Design, and Simulation*. The problem is, however, that first-order modulators are so tonal that, even with a 50 dB reduction of the quantization noise, a high oversampling ratio will be required to obtain high performance.

Some improvement can be obtained by splitting the transfer function $\widehat{NTF}(z)$ between a stage applied before the D/A conversion and a single differentiation after the D/A converter (shown in FIG. 3 in U.S. Pat. No. 5,369,403). This would preserve the matching of $\widehat{NTF}(z)$ and NTF(z) while improving the signal-band performance. This will require some additional hardware. Furthermore, as it will be explained, if the OSR is to be low, then it may not work very well.

Matching of Second-Order Filters

To obtain high performance at a low oversampling ratio, it is necessary to filter the output from the multibit D/A converter with a second- or higher-order analog filter. Such a filter will unavoidably cause significant nonidealities in the system.

The problem is not the suppression of the nonlinearity error signal m(k); it will be sufficiently suppressed unless the implementation of the filter is extremely poor. The problem is the difference in the phase shifts of the noise transfer function NTF(z) and its part-analog replica $\widehat{NTF}(z)$. Analysis shows that the compensation of the shaped quantization noise works well outside the signal band, but not in the signal band.

What is not generally known is that the above-mentioned problem can be solved. If the signal band quantization noise cannot be removed by compensation, the system should be designed not to rely on this. A way to obtain the insensitivity needed is to reduce the signal-band quantization noise in v(k), i.e., to increase the order of the modulator. By doing so, the system's signal-band performance may be degraded by about 3 dB (relative to plain single-bit operation); but the out-of-the-signal-band quantization noise will be reduced significantly, say 50 dB. There are, however, a number of disadvantages:

To preserve good matching of $\widehat{NTF}(z)$ and $NTF(z)$, most of $\widehat{NTF}(z)$ should be implemented in the digital domain. This has hardware penalties.

A delta-sigma modulator of order higher than 2 will in general have to be stabilized by introducing nonlinearities other than the quantizer. Examples of such nonlinearities include saturation and reset operations of the internal filter stages. When such operations are performed, $\widehat{NTF}(z)$ will not match $NTF(z)$ and large noise spikes will be encountered in $n(k)$.

The main advantage of high-order dual-quantization delta-sigma D/A converters is that $LPF(z)$ can be a simple low-order filter. However, if the filter must be able to remove such spikes, it is not easy to design.

OBJECTS AND ADVANTAGES

Accordingly, several objects and advantages of this invention are listed below:

To provide a simple high-resolution oversampled D/A converter which error signal has very little out-of-the-signal-band power. The analog filter $LPF(z)$ can thereby be implemented as a very simple filter.

To provide a simple high-resolution oversampled D/A converter where the analog filter $LPF(z)$ can be omitted. This requires that the system which the D/A converter is driving (for instance a set of headphones+ the human ear) provides some filtering.

To provide a high-resolution low-complexity scaled-element mismatch-shaping D/A converter.

To provide a mismatch-shaping D/A converter with a complexity which is proportional to the resolution measured in bits.

To provide a second- or higher-order scaled-element mismatch-shaping D/A converter.

To provide a conceptually new way to think of D/A conversion and to implement D/A converters.

To provide a D/A converter which is based on error compensation (like dual quantization) and which
can be made of high order without being sensitive to modulator non-linearities;
does not generate spikes in the output; and
does not rely on analog filters of order higher than one.

To provide a D/A converter which, without calibration and in a main-stream technology, will offer 16 bits of accuracy at around 10 times oversampling.

To provide a simple high-resolution mismatch-shaping D/A converter which does not delay the signal. It can, therefore, be used as a feedback element in many types of A/D converters.

The list goes on; FIGS. 18 and 19 will adequately illustrate the superior performance which can be obtained.

Further objects and advantages will become apparent from a consideration of the drawings and ensuing description.

DRAWING FIGURES

FIG. 4 shows a model which is used to explain the basic concept of delta-sigma D/A converters.

FIG. 5 shows, for a baseband delta-sigma D/A converter, where in the Z-plane the noise transfer function's zeros should be located.

FIG. 6 shows how much suppression of signal-band errors that mismatch shaping and oversampling can provide.

REFERENCE NUMERALS IN DRAWINGS

Figure 1:
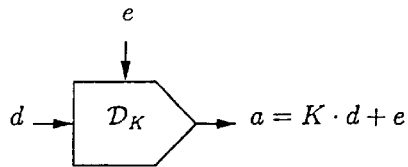
FIG. 1 shows the symbol which will be used to represent a generic (non-specified) D/A converter.
Figure 2:
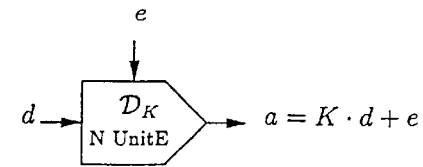
FIG. 2 shows the symbol which will be used to represent a unit-element D/A converter.
Figure 3:
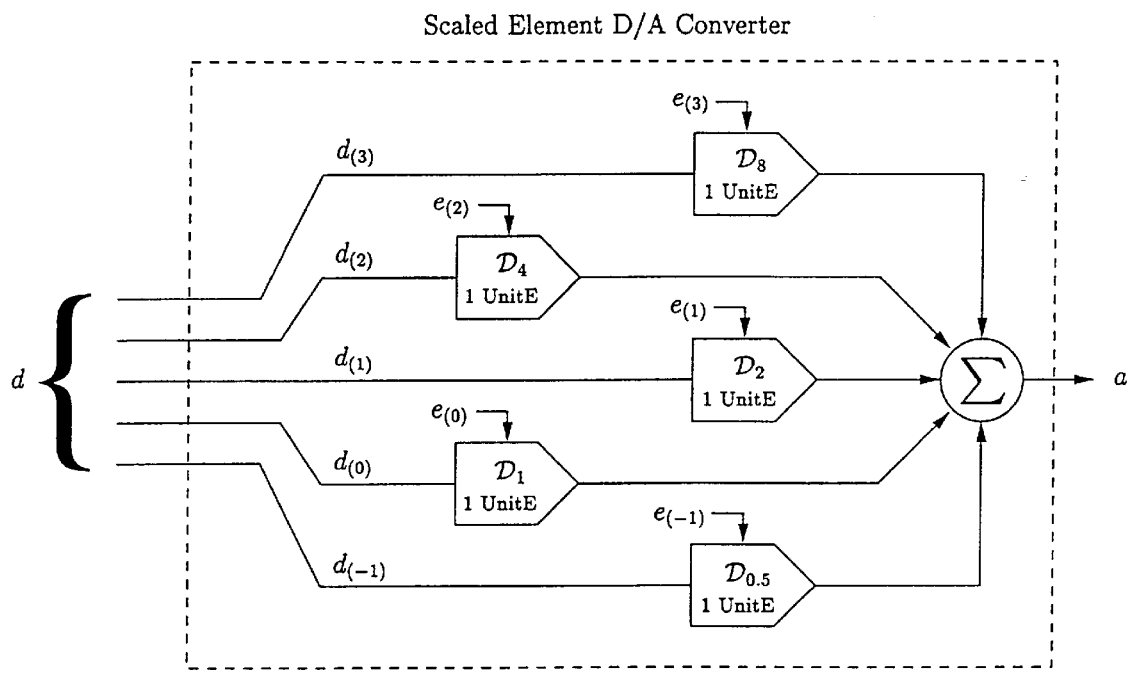
FIG. 3 shows the general concept for a binary-weighted D/A converter.
Figure 7:
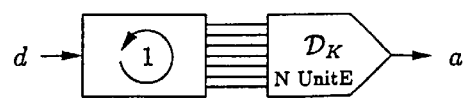
FIG. 7 shows the symbol which will be used to represent a unit-element mismatch-shaping D/A converter.
Figure 8:
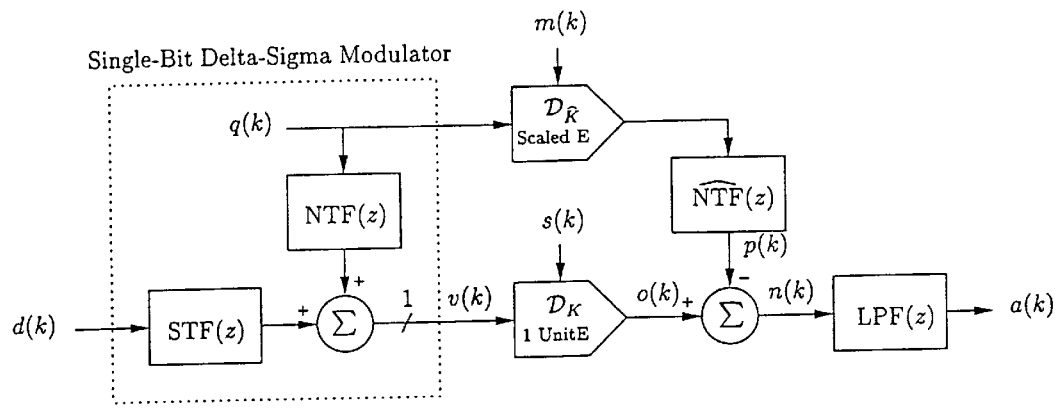
FIG. 8 shows the general concept for dual-quantization D/A converters.

| | |
|---|---|
| 100 General D/A converter system. | 102 General separator. |
| 104 Main D/A converter. | 106 Main analog filter. |
| 108 Array of D/A converters. | 110 Array of analog filters. |
| 112 Analog adder. | 114 Analog signal-band filter. |
| 116 Internal D/A converter. | 118 Internal D/A converter. |
| 120 Internal D/A converter. | 122 Internal analog filter. |
| 124 Internal analog filter. | 126 Internal analog filter. |
| 200 D/A converter system. | 202 Separator (main). |
| 204 Main D/A converter (binary). | 208 D/A converter. |
| 210 Analog filter (SC). | 212 Analog adder. |
| 214 Analog signal-band filter. | |
| 230 Digital subtractor. | 232 First filter stage. |
| 234 Second filter stage. | 236 Third filter stage. |
| 238 Fourth filter stage. | 240 Controller. |
| 242 Quantizer. | |
| 302 Separator (main). | 330 Digital subtractor. |
| 332 First filter stage. | 334 Second filter stage. |
| 336 First simple sub-separator. | 338 Second simple sub-separator. |
| 340 Trailing filter section. | 342 Controller. |
| 402 Separator (main). | 404 First sub-separator (basic). |
| 406 Cascade of simple separators. | 408 Array of digital filters. |
| 502 Separator (main). | 504 First sub-separator (basic). |
| 506 Second sub-separator (simple). | 508 Third sub-separator (basic). |

-continued

| | |
|---|---|
| 510 Fourth sub-separator. | 512 Array of digital filters. |
| 530 Digital subtractor. | 532 First filter stage. |
| 534 Second filter stage. | 540 Controller. |
| 542 Quantizer. | 550 Digital adder. |
| 552 Simple separator (quantizer). | 554 Delay element. |
| 560 Common node. | 562 Operational amplifier. |
| 564 Feedback element. | 566 Main D/A converter (binary). |
| 568 Binary weighted capacitors. | 570 Array of capacitor pairs. |
| 572 Array of identical capacitors. | 574 Array of DWA coders. |
| 576 DWA coder. | |
| 602 Separator (main). | 604 First sub-separator (basic). |
| 606 Second sub-separator (basic). | 608 Third sub-separator (basic). |
| 610 Main mismatch-shaping DAC. | 612 Mismatch-shaping DAC. |
| 614 Mismatch-shaping DAC. | 616 Mismatch-shaping DAC. |
| 618 DWA coder. | 620 DWA coder. |
| 622 DWA coder. | 624 DWA coder. |
| 626 Unit-element current DAC. | 628 Unit-element current DAC. |
| 630 Unit-element current DAC. | 632 Unit-element current DAC. |
| 634 Load. | |

SUMMARY OF THE INVENTION

According to this invention, a D/A conversion includes the following steps: separation into a plurality of signals, individual D/A conversion of the plurality of signals (possibly by mismatch-shaping D/A converters), individual filtering of the plurality of signals, summing of the plurality of D/A-converted and filtered signals, and if necessary a final analog filtering.

DESCRIPTION OF PREFERRED EMBODIMENTS

To begin with, the general structure is described. This is done to give the reader a general understanding of the nature of the disclosed D/A converter systems. Guidelines are given for how to design and optimize a system. Then, five preferred embodiments will be described. The embodiments are increasingly more sophisticated attempts to meet the design guidelines.

The first embodiment illustrates a simple system which is somewhat similar to a dual-quantization D/A converter. There are, however, important differences and advantages. The basic separator, which is a key element, is described in detail.

The second embodiment shows a generalization of the basic separator. The purpose of this embodiment is to give the designer an extra tool to design a separator to meet specific needs.

The third and fourth embodiments illustrate how a second-order scaled-element mismatch-shaping D/A converter system based on switched-capacitors circuits can be implemented in a basic integrated circuit technology. These embodiments are found to be highly useful for integrated circuit applications.

The fifth embodiment illustrates how it is possible to make use of the invention in systems where there are few design options (for instance in high-power systems).
Definitions and Terminology
This section will define the terms, "bit number" and "separator." These terms will be used repeatedly in the description of the invention.
Definition of the Term, "Separator"
A separator is a system that separates an input d(k) into a main signal v(k) and one or more compensation signals $b_0(k), b_1(k), \ldots, b_N(k)$. The only requirement is that there exists a set of filters $H_D(z), H_V(z), H_{B:0}(z), H_{B:1}(z), \ldots, H_{B:N}(z)$ for which the following Equation 1 is fulfilled:

$$D(z)H_D(z) = V(z)H_V(z) + B_0(z)H_{B:0}(z) + B_1(z)H_{B:1}(z) + \ldots + B_N(z)H_{B:N}(z) \quad (1)$$

Note that Equation 1 does not completely describe a separator. Different separators may be described by the same Equation 1.
Terminology When Referring to a Bit in a Signal
Signals of various magnitude and resolution will be discussed repeatedly. To prevent confusion, a consistent terminology will be introduced. The binary number system is used as an example, but it is to be understood that other number systems can be used as well.

All signals occurring in the discussed embodiments are represented in the binary number system. If negative numbers are to be represented, then a two's complement coding is appropriate. It is assumed that any digit occurring in any signal in the discussed embodiments will have a weight which is a power of two, $1 = 2^0$ being the lowest weight used. The digit terminology will not be used. The signals will be represented by their bits; i.e., the digits combined with their weights. Any bit in any signal will therefore always represent one of two possible values: 0 or $2^i$ where i is an integer or zero. The only exception is the most significant bit in a signal represented by a two's complement (where the possible values are 0 and $-2^i$).

Figure 9:
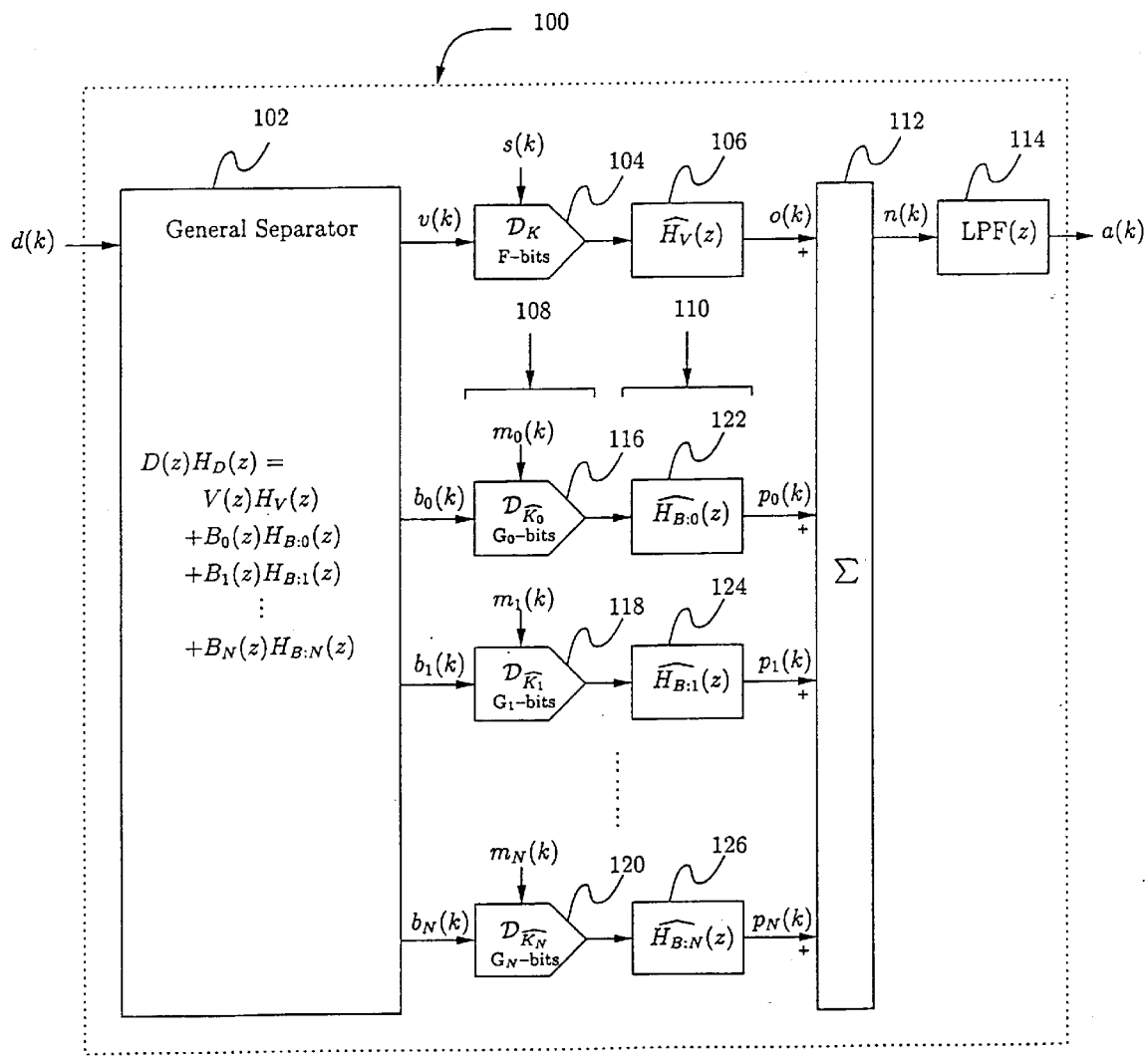
FIG. 9 shows the general concept of D/A converters implemented according to this invention.

The text refers to a bit's number as the power of two in its non-zero value. For example, "the third bit" refers to the bit which can have only the two values 0 or ±8. A bit's number does not refer to its position relative to the least significant bit in the signal. The terms, "least significant bit" (LSB) and "most significant bit" (MSB), do only make sense when they refer to a specific signal. The MSB of a signal is the bit (in that signal) which has the highest bit number. The LSB of a signal is the bit (in that signal) which has the lowest bit number. Therefore, the terms MSB and LSB do not refer to specific bit numbers.
Description of the General Structure FIG. 9 shows the general structure [100] of an oversampled D/A converter system according to the invention. A separator [102] separates a digital input signal d(k) into a main digital signal v(k) and a set of one or more digital compensation signals: $b_0(k), b_1(k), \ldots, b_N(k)$. The operation of the separator [102] can be described by Equation 2:

$$D(z)H_D(z) = V(z)H_V(z) + \sum_{i=0}^{N} B_i(z)H_{B:i}(z) \quad (2)$$

The main signal v(k) is D/A converted by a main D/A converter [104] and filtered by a main analog filter [106] whereby a main analog signal o(k) is generated. The compensation signals $b_0(k), b_1(k), \ldots, b_N(k)$ are individually D/A converted by an array of D/A converters [108] and subsequently filtered by an array of analog filters [110], whereby a set of analog compensation signals $p_0(k), p_1(k), \ldots, p_N(k)$ is generated.

The gain K of the main D/A converter [104] and the gains $\widehat{K}_0, \widehat{K}_1, \ldots, \widehat{K}_n$ of the other D/A converters [108] are designed to match the same value K. The transfer function $\widehat{H}_V(z)$ of the main analog filter [106] should be designed to match $H_V(z)$ of the separator [102], as described by Equation 2. Similarly, the transfer functions $\widehat{H}_{B:0}(z), \widehat{H}_{B:1}(z), \ldots, \widehat{H}_{B:N}(z)$ of the filters in the array of analog filters [110]

should be designed to match the transfer functions $H_{B:0}(z)$, $H_{B:1}(z), \ldots, H_{B:N}(z)$ of the separator [102], as described by Equation 2.

The main analog signal o(k) and the analog compensation signals $p_0(k), p_1(k), \ldots, p_N(k)$ are added in an analog adder [112]. The output from the adder [112], called the analog estimation signal n(k), is filtered by an analog filter [114] to form the overall analog output signal a(k).

FIG. 9 shows three D/A converters [118] [118] [120] in the array of D/A converters [108] and, consequently, three filters [122] [124] [126] in the array of analog filters [110].

Is is to be understood that the general structure [100] and the invention as such include the following variations:

There can be a single compensation signal as well as a multitude of compensation signals.

Some or all the analog filters [106] [110] [114] may be simple signal paths.

Some of the analog compensation signals may not be generated or included in the analog estimation signal n(k).

Operation of the General Structure

The main digital signal v(k) and the digital compensation signals $b_0(k), b_1(k), \ldots, b_N(k)$ are individually D/A converted and filtered to form the main analog signal o(k) and the analog compensation signals $p_0(k), p_1(k), \ldots, p_N(k)$. The scaling and filtering of the signals o(k), $b_0(k), b_1(k), \ldots, b_N(k)$ are chosen according to Equation 2, such that the sum of the signals o(k), $p_0(k), p_1(k), \ldots, P_N(k)$, the analog estimation signal n(k), in the ideal case is an analog replica of the digital input signal d(k).

Modeling Errors

Due to circuit imperfections, errors will be injected in the system [100] and become a part of the analog estimation signal n(k). The purpose of the separation is to facilitate the filtering, or suppression by other means, of the errors in the signal band before they are included in the estimation signal n(k).

The following discussion will assume that the analog signal-band filter [114] is a simple signal path (i.e., LPF(z)= 1). The designer may choose to implement a simple filter [114], but, as it will be demonstrated, it will in many cases not be necessary.

As will be described, the main D/A converter [104] will nearly always define the system's [100] gain. Using this gain K as the reference, Equation 2 describing the separator [102], leads to Equation 3, which describes the analog estimation signal n(k) in the ideal case:

$$N_{ideal}(z) = K\left[V(z)H_V(z) + \sum_{i=0}^{N} B_i(z)H_{B:i}(z)\right] \quad (3)$$

However, due to element mismatch, the analog estimation signal will instead be described by $$N_{actual}(z) = KV(z)\hat{H}_V(z) + S(z)\hat{H}_V(z) + \sum_{i=0}^{N}\left[\hat{K}_i B_i(z) + M_i(z)\right]\hat{H}_{B:i}(z), \quad (4)$$

where a(k) is the error signal from the main D/A converter [104] and $m_i(k)$ the error signals from the other D/A converters [108].

By subtracting Equation 3 from Equation 4, Equation 5 expressing the D/A converter system's [100] error signal is obtained:

$$E(z) = KV(z)\left[\hat{H}_V(z) - H_V(z)\right] + \quad (5)$$

$$\sum_{i=0}^{N} B_i(z)\left[\hat{K}_i \hat{H}_{B:i}(z) - KH_{B:i}(z)\right] +$$

$$S(z)\hat{H}_V(z) + \sum_{i=0}^{N} M_i(z)\hat{H}_{B:i}(z)$$

The first part of the error signal, $KV(z)[\hat{H}_V(z)-H_V(z)]$, is not critical; especially in the typical case where the main analog filter [106] is a simple signal path.

The second part of the error signal, $$\sum_{i=0}^{N} B_i(z)\left[\hat{K}_i \hat{H}_{B:i}(z) - KH_{B:i}(z)\right],$$

will in the following be called "gain-mismatch errors." The third part of the error signal, $$S(z)\hat{H}_V(z) + \sum_{i=0}^{N} M_i(z)\hat{H}_{B:i}(z),$$

will be called "nonlinearity errors." These definitions will turn out to be very useful when the system [100] is to be designed and evaluated. Notice that this model is just one of many possible models.

Nonlinearity Errors

Nonlinearity errors are due to element mismatch within each D/A converter [104] [108]. In other words, it is a local mismatch that is defined with respect to the specific D/A converter of consideration.

Gain-Mismatch Errors

Gain-mismatch errors are, on the other hand, globally defined. They are caused by mismatch of the gains of the individual D/A converters in the array of D/A converters [108] relative to the gain of the main D/A converter [104].

The purpose of the separation performed by the separator [102] is to facilitate suppression of all errors in the signal band. Below is described how this can be obtained.

Suppression of Gain-Mismatch Errors

All gain-mismatch errors are of the same structure which is the product of a compensation signal $b_i(k)$ and the difference between two filters $[\hat{K}_i \hat{H}_{B:i}(z)-KH_{B:i}(z)]$.

Matching an analog filter's transfer function $\hat{K}_i \hat{H}_{B:i}(z)$ to the transfer function $KH_{B:i}(z)$, which is defined by the digital separator [102], is a very difficult design task. It is generally unwise to let the operation of a converter depend heavily on such a matching. There is, however, an exception; if the filter is a first order difference, $H_{B:i}(z)=(1-z^{-1})$, then a switched-capacitor implementation of $\hat{H}_{B:i}(z)=(1-z^{-1})$ can be expected to match very well. This will be exemplified in a preferred embodiment.

Those skilled in the art will be able to, when evaluating a given circuit, evaluate the worst-case transfer function $[\hat{K}_i \hat{H}_{B:i}(z)-KH_{B:i}(z)]$. This evaluation can be used to estimate the suppression of the compensation signal $b_i(k)$ as an error source.

In the embodiments used as examples, matching the gain factors $[\hat{K}_i - K]$ is the main concern. When the error signals are referred to full-scale output, it is, however, the relative matching of the gain factors which is of interest.

Conclusion

When $\hat{H}_{B;i}(z)$ can be expected to accurately match $H_{B;i}(z)$, the gain-mismatch errors can be modeled as the filtered compensation signals $H_{B;i}(z)B_i(z)$, suppressed by 50–60 dB (typical expected value for relative matching of gain factors when a mainstream technology is used).

Even if good matching of high-order filters cannot be assured, a very low signal-band contents of gain-mismatch errors can be obtained by designing the separator [102] such that the digital compensation signals have very little power in the signal band (i.e., using shaped compensation signals). Obviously, a small compensation signal will have a small overall power; it will therefore not have to be shaped as much as a large compensation signal.

Comment on Dual-Quantization D/A Converters

The general structure [100] can also model dual-quantization D/A converters. They have only one compensation signal, the quantization noise, and accordingly only one gain-mismatch error: $Q(z)[\hat{K}\widehat{NTF}(z) - K\,NTF(z)]$. The reason why dual-quantization D/A converters are difficult to implement is that the compensation signal is not shaped (it is usually modeled as white noise). Consequently, the success of the topology depends heavily on how well the filter $\hat{K}\widehat{NTF}(z)$ matches $K\,NTF(z)$.

Suppression of Non-Linearity Errors

There are two kinds of nonlinearity errors: the main nonlinearity error $S(z)\hat{H}_v(z)$ from the main D/A converter [104] and the nonlinearity errors $$\sum_{i=0}^{N} M_i(z)\hat{H}_{B;i}(z)$$

from the D/A converters [108] converting the digital compensation signals.

To suppress gain-mismatch errors, one signal is required to carry the main part (the signal-band contents) of the input signal d(k). This is the purpose of the main digital signal v(k), thus it is nominated to be the main signal. This implies that $\hat{H}_v(z)$ will not suppress the signal band significantly. Any signal-band part of the main nonlinearity error s(k) will, therefore, flow directly to the estimation signal n(k). Consequently, the main D/A converter [104] should be designed either as a two-level or as a mismatch-shaping D/A converter.

A second-order mismatch-shaping D/A converter will be demonstrated as a preferred embodiment. To avoid the complexity of implementing a second-order unit-element mismatch-shaping D/A converter, the main D/A converter [104] can be chosen as a two-level device.

The other nonlinearity errors $$\sum_{i=0}^{N} M_i(z)\hat{H}_{B;i}(z)$$

are caused by the D/A converters [108] converting the digital compensation signals. These errors will be filtered by the analog filters [110] which can be designed to suppress the signal band.

Conclusion

The main nonlinearity error $S(z)\hat{H}_v(z)$ can be avoided by choosing the main digital signal v(k) as a binary (two-level) signal. If v(k) is a multi-level signal, the main D/A converter [104] should be mismatch-shaping.

The other nonlinearity errors can be suppressed in two ways: either by using mismatch-shaping D/A converters [108] or by designing the separator [102] such that the analog filters [110] suppress the signal band. The two techniques can be combined; first-order mismatch-shaping D/A converters [108] followed by first-order analog filters [110] will result in second-order-shaped nonlinearity errors.

Obviously, if a compensation signal is small, then the respective nonlinearity error will have a small overall power. It will, therefore, not require as much shaping as a nonlinearity error from large compensation signals.

Design Strategy

It will be demonstrated that the separator can be designed in many ways and to meet various needs. The following list summarizes what can and should be done to obtain good performance at low cost:

The main D/A converter [104] must be as good as the overall system specification [100]. It should be implemented as a two-level or mismatch-shaping D/A converter [104].

Large compensation signals can be shaped to help suppress gain-mismatch errors.

Nonlinearity errors can be shaped by analog filters [110].

Nonlinearity errors can be shaped by using mismatch-shaping D/A converters [108].

Large compensation signals should have a low resolution (to keep the mismatch-shaping D/A converters [108] simple).

Small compensation signals will cause small errors. Hardware may be saved by shaping these signals less.

A First Embodiment

Figure 10:
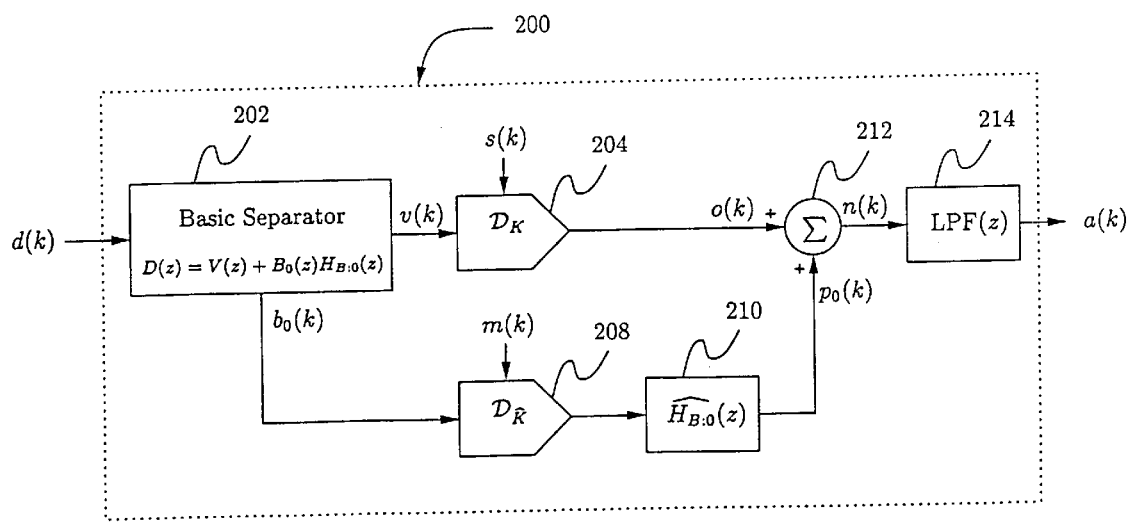
FIG. 10 shows a simple first embodiment of a D/A converter according to the invention.

FIG. 10 shows a first embodiment of the general structure [100]. FIG. 10 and subsequent Figures illustrating other embodiments will use numerals different from those used in FIG. 9.

Description of the First Embodiment

The separator [202] in FIG. 10 implements the separator [102] in the general structure [100]. It separates the digital input signal d(k) into the main digital signal v(k) and only one digital compensation signal $b_0(k)$. The main digital signal v(k) is converted by a main D/A converter [204] implementing the main D/A converter [104] in the general structure [100]. The main analog filter [106] is a simple signal path, so the output from the main D/A converter [204] is the main analog signal o(k). The digital compensation signal $b_0(k)$ is D/A converted by a D/A converter [208], and subsequently filtered by an analog filter [210] providing the only analog compensation signal $p_0(k)$. The main analog signal o(k) and the analog compensation signal $p_0(k)$ are added in an analog adder [212] providing the analog estimation signal n(k). The analog estimation signal n(k) is optionally filtered by an analog filter [214], removing out-of-the-signal-band errors.

Except for the separator [202], the system [200] is comparable to a dual-quantization D/A converter described in the prior art. In this embodiment, it is assumed that the two D/A converters [204] and [208], the analog filters [210] and [214], and the analog adder [212] are implemented according to the prior art. FIG. 4 in U.S. Pat. No. 5,369,403; FIGS. 10.18 and 10.33 in the book *Delta-Sigma Data Converters;*

*Theory, Design, and Simulation,* and the text accompanying those Figures, illustrate appropriate techniques for this purpose. The separator [202] is, however, implemented in a novel and improved way. It will be described in detail in a following section.

Operation of the First Embodiment

The general structure [100] and its operation was described in a previous section. The key component is the separator [202], which separates the input signal d(k) according to Equation 6:

$$D(z)=V(z)+B_0(z)H_{B:0}(z) \qquad (6)$$

according to which the remaining part of the system [200] is to be designed.

In the generation of the main digital signal v(k), the separator [202] operates as a delta-sigma modulator. However, by extracting additional signals from the modulator, it becomes a separator. It is a key point that the delta-sigma modulator can be designed without paying much attention to the transfer function $H_{B:0}(Z)$. Consequently, the separator [202] can be designed such that there, in the signal band, is very little difference between the input signal d(k) and the main output signal v(k). The difference between these two signals is described by $B_0(z) H_{B:0}(z)$. Consequently, if the delta-sigma modulator is designed of a higher order than the order of the transfer function $H_{B:0}(z)$, the compensation signal $b_0(k)$ will have relatively less power in the signal band (it is shaped).

Gain-Mismatch Errors

According to the description of the general structure [100], it is an advantage that the compensation signal $b_0(k)$ is shaped. The advantage is that the signal-band contents of the gain-mismatch error $B_0(z)[\widehat{K_0}\widehat{H_{B:0}}-KH_{B:0}]$ will be less dependent on the cancellation in the second term $[\widehat{K_0}\widehat{H_{B:0}}-KH_{B:0}]$. In other words, the system's [200] signal-band performance will be less sensitive to whether the analog filter [210] has the exact transfer function $H_{B:0}(z)$ or whether it is just a close match. A given performance can therefore be obtained using less ideal circuitry. In reality, it is a requirement to make a high-performance system work at all.

Non-Linearity Errors

Assuming that the main D/A converter [204] is a two-level or a mismatch-shaping D/A converter, the nonlinearity error s(k) will be small in the signal band.

Because the resolution of the compensation signal $b_0(k)$ is high, it will have to be D/A converted by a non-mismatch-shaping D/A converter [208], for example a scaled-element D/A converter. The nonlinearity error from this D/A converter [208] will be m(k) filtered by the analog filter [210]. Because the power of m(k) will be considerably, say by 60 dB, smaller than the power of the analog estimation signal n(k), it will not have to be shaped very much. The order of the analog filter [210] can therefore be low.

An Example

Assume that the separator [202] is of second order while the analog filter [210] is of first order.

Basic technologies typically offer a relative matching of around −60 dB for large geometries. In such a technology, the system will offer a performance which is described by a first-order-shaped error with a −60 dB Nyquist-band power. According to FIG. 6, that is equivalent to about 16 bits of accuracy at 30 times of oversampling.

The system can also be designed to offer second-order noise-shaping, but a more efficient topology will be discussed as another embodiment. The following will describe the separator [202] in detail.

Description of the Basic Separator

Figure 11:
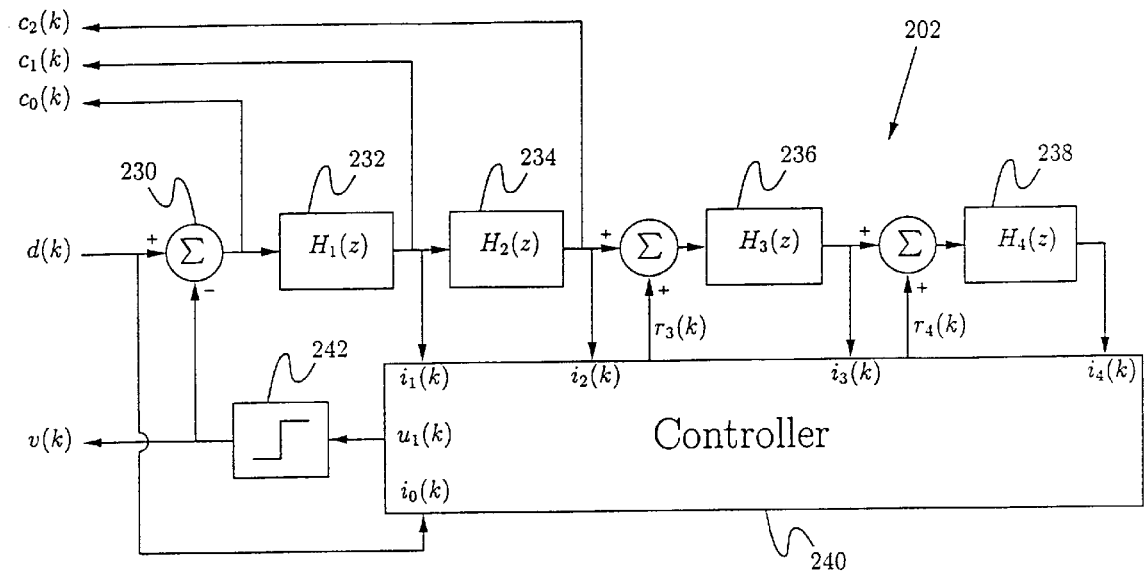
FIG. 11 shows how a basic separator, as used in the first and other embodiments, can be implemented.

FIG. 11 shows how the separator [202] can be implemented by means of a delta-sigma modulator. This separator [202] is a fundamental building block which will be used again and again. It will be referred to as the "basic separator."

The basic separator [202] produces two output signals v(k) and $b_0(k)$ as a function of the input signal d(k). The signals v(k) and d(k) are the same in FIGS. 10 and 11. The compensation signal $b_0(k)$ in FIG. 10 can be one of the three signals $c_0(k)$, $c_1(k)$, $c_2(k)$ shown in FIG. 11. The operation, but not the implementation, of the basic separator [202] will depend on which one of these three signals is used as the compensation signal $b_0(k)$. The choice determines the transfer function $H_{B:0}(z)$ which characterizes the separator [202] as described by Equation 6.

The Structure

A digital subtractor [230] subtracts the main digital signal v(k) from the digital input signal d(k). The result from this subtraction is used as input to a first filter stage [232]. The output of the first filter stage [232] is used as input to a second filter stage [234]. The output of the second filter stage [234] is added to a signal $r_3(k)$, which is supplied by a controller [240], and the result is used as input to a third filter stage [236]. The output of the third filter stage [236] is added to a signal $r_4(k)$, which is also supplied by the controller [240], and the result is used as input to a fourth filter stage [238].

The controller [240] generates three signals: $u_1(k)$, $r_3(k)$, and $r_4(k)$. These three signals are generated as a function of five input signals: $i_o(k)$ which is the same as the separator's [202] input signal d(k), and the output signals, $i_1(k)$, $i_2(k)$, $i_3(k)$, and $i_4(k)$, from the four filter stages [232] [234] [236] [238].

The signal $u_1(k)$, generated by the controller [240], is fed to a quantizer [242]. The output from the quantizer [242] is the separator's [202] main output v(k). The signal $c_0(k)$ is the output from the digital subtractor [230]; the signal cl (k) is the output from the first filter stage [232]; and the signal $c_2(k)$ is the output from the second filter stage [234].

Variations

It is to be understood that the separator as well can be based on more of fewer filter stages. It is important to note that no signals, except d(k) and v(k), are fed to any node in the chain of filters [232][234][236][238] which has a signal path to the compensation signal $b_0(k)$ that does not pass through the quantizer [242]. For example, if $c_1(k)$ is used as the compensation signal $b_0(k)$, it is allowed to add a signal $r_2(k)$ from the controller [240] to the input of the second filter stage [234]. This is, however, not allowable if $c_2(k)$ is used as the compensation signal $b_0(k)$. As exemplified by a second embodiment, this rule may be violated, but it requires careful consideration of how the digital input signal d(k) can be reconstructed on basis of the main digital signal v(k) and the compensation signals $b_i(k)$.

Operation of the Basic Separator

The basic separator [202], considered from the input d(k) to the main output v(k) will be recognized, by those skilled in the art, as a generic delta-sigma modulator implemented in a specific topology (often called the "Cascaded Integrators Feed-Forward," or CIFF topology). For instance, compare FIG. 11 with FIGS. 5.6 and 5.7 in the book, *Delta-Sigma Data Converters; Theory, Design, and Simulation.* One can identify that the controller [240] there generates $u_1(k)$, $r_3(k)$, $r_4(k)$ as scaled sums of $i_0(k)$, $i_1(k)$, $i_2(k)$, $i_3(k)$, and $i_4(k)$. Many delta-sigma modulators are designed in this way. The coefficients in these scaled sums can for instance be obtained using a design tool like *The Delta-Sigma Toolbox* written by Richard Schreier. At the time of this writing, this excellent toolbox was offered for free and can be found on the Internet (anonymous FTP) at: "next242.ece.orst.edu/pub/delsig.tar.Z."

Analysis

The operation of the basic separator [202] is remarkably simple to analyze (assuming that the controller assures the system's stability). According to the definition of subtraction, the operation of the subtractor [230] can be described as follows:

$$c_0(k)=d(k)-v(k) \text{ i.e. } D(z)=V(z)+C_0(z) \qquad (7)$$

According to the definition, the system is a separator when $c_0(k)$ is used as the only compensation signal $b_0(k)$.

Another separation, which is more useful for the first embodiment, results if $c_1(k)$ is used as the only compensation signal $b_0(k)$:

$$C_1(z) = H_1(z)[D(z) - V(z)] \text{ i.e. } D(z) = V(z) + \frac{C_1(z)}{H_1(z)} \qquad (8)$$

For the basic separator [202], and for delta-sigma modulators in general, the filter stages [232][234][236][238] in the loop have high gain in the signal band. Consequently, the separation performed by is separator [202] will, as desired, cause the spectral components of $c_1(k)$, including any errors, to be suppressed in the signal band before they are included in the analog output signal.

For example, for a baseband modulator, the first filter stage can be an integrator;

$$H_1(z) = \frac{1}{1 - z^{-1}}.$$

In that case, the following very useful separation will be performed:

$$D(z)=V(z)+C_1(z)(1-z^{-1}) \qquad (9)$$

It is sometimes simpler or cheaper, but never a necessity, to implement the filter stages as delaying integrators;

$$H_1(z) = \frac{z^{-1}}{1 - z^{-1}}.$$

In that case, the following separation will be performed, assuming that $c_1(k)=b_0(k)$:

$$z^{-1}D(z)=z^{-1}V(z)+C_1(z)(1-z^{-1}) \qquad (10)$$

This Equation expresses that $v(k)$ and $c_1(k)$ can be combined to form $d(k)$ delayed by one sample. In some applications, such as compact-disc-playback units etc., delay is perfectly tolerable. For other applications, for instance when used as a feedback element in an A/D converter, delay may not be tolerable. Fortunately, it is always possible to redesign the controller [240], and replace a delaying filter stage [232] [234][236][238] by a non-delaying stage.

Conclusion

No matter from which point in the chain of filter stages [232][234][236][238] the compensation signal $b_0(k)$ is extracted, the separation can be written in the form:

$$D(z)=V(z)+C(z)H_{B:0}(z) \qquad (11)$$

In this Equation, $H_{B:0}(z)$ is the reciprocal of the product of the transfer functions of the filter stages [232][234] between the subtractor [230] and the node from which $b_0(k)$ is extracted.

If one or more filter stages are delaying, Equation 11 may have to be multiplied by $z^{-\omega}$, corresponding to a delay of $\omega$ samples, to make $H_{B:0}(z)z^{-\omega}$ implementable.

Must the Controller be Linear?

The only assumptions made in the above analysis were that the filter stages [232][234] used in the expression for $H_{B:0}(z)$ have high gain in the signal band and that the modulator is stable. As explained below, the quantization noise is not a parameter to be concerned about.

The quantization noise has to do with the signals occurring at the input and the output of the quantizer [242]. The concept was introduced while analyzing delta-sigma modulators in which the controller [240] generates the control signals as linear combinations of its input signals. In the analysis, the quantizer [242] was replaced by a linear model consisting of a gain element and an adder in which a signal called the quantization noise is injected. By doing so the modulator becomes linear; it is a linear filter with two input signals: $d(k)$ and the quantization noise.

The method has been used, with some success, to determine linear combinations for use in the controller [240], for which the modulator [202] is stable. However, for high-order modulators, the method tends to fail. Occasional saturation or reset of some filter stages [236][238] seems to be necessary to assure the stability of the modulator [202]. In other words, to preserve stability, the controller [240] should have at least some nonlinearity built into it. Saturation and reset of the third and fourth filter stage [236][238] is represented by the signals $r_3(k)$ and $r_4(k)$, respectively.

The dual-truncation principle, as it is described in U.S. Pat. No. 5,369,403, fails when the controller [240] is nonlinear. If the controller [240] is nonlinear, then the noise transfer function NTF(z) will be nonlinear. To obtain good compensation for the quantization noise, the replica $\widehat{NTF}$ of NTF(z) must have the same nonlinearities as those of NTF(z). It will be very difficult, if not impossible, to implement such nonlinearities. As mentioned above, the consequence is large spikes in the output.

It is a key feature in the basic separator that the separation does not at all depend on how the controller is implemented. It may be linear, or it may be nonlinear; it does not matter. What matters is that the compensation signal remains bounded.

Stability

Consider a baseband modulator in which all the filter stages [232][234][236][238] are integrators. In the prior art, the signals $r_3(k)$ and $r_4(k)$ are used only to stabilize the modulator [202] in critical situations. FIG. 5.7 in the book, *Delta-Sigma Data Converters; Theory, Design, and Simulation,* shows a small amount of feedback from $i_4(k)$ to $r_3(k)$ to produce a distribution of the modulator's zeros in the signal band. However, this variation does not compromise the following discussion. Consequently, during normal operation, the controller [240] assures the separator's [202] stability solely by means of $v(k)$.

Stability essentially means that the output from each and all the filter stages [232][234][236][238] remains bounded in magnitude. Controlling a cascade of N integrators from one end can be compared to backing a truck with N trailers;

each trailer's orientation is the output of the corresponding integrator. Obviously, stability is not easy to assure for high-order modulators/separators. With this analogy in hand, it can be understood that, to preserve stability, it, from time to time, may be required to do something drastic like resetting an integrator or two (aligning of the trailers).

Stability can, however, be assured without resetting or saturating the first two filter stages [232] [234]. This will leave the operation of the basic separator [202] insensitive to nonlinearities in the controller [240].

Nonlinear Controllers

A main priority in the design of the basic separator [202] is to keep the magnitude of the compensation signal $b_0(k)$ as low as possible. It is a priority because the chip area and the power consumption of the overall system will depend significantly on the maximum value of $b_0(k)$. Also, and of equal importance, because the system's [200] performance will be inversely proportional to the maximum value of $b_0(k)$.

A second main priority in the design of the separator [202] is not to reset or saturate the subsequent filter stages [236] [238] too often (otherwise they serve very little or no purpose).

A Second Embodiment

Figure 12:
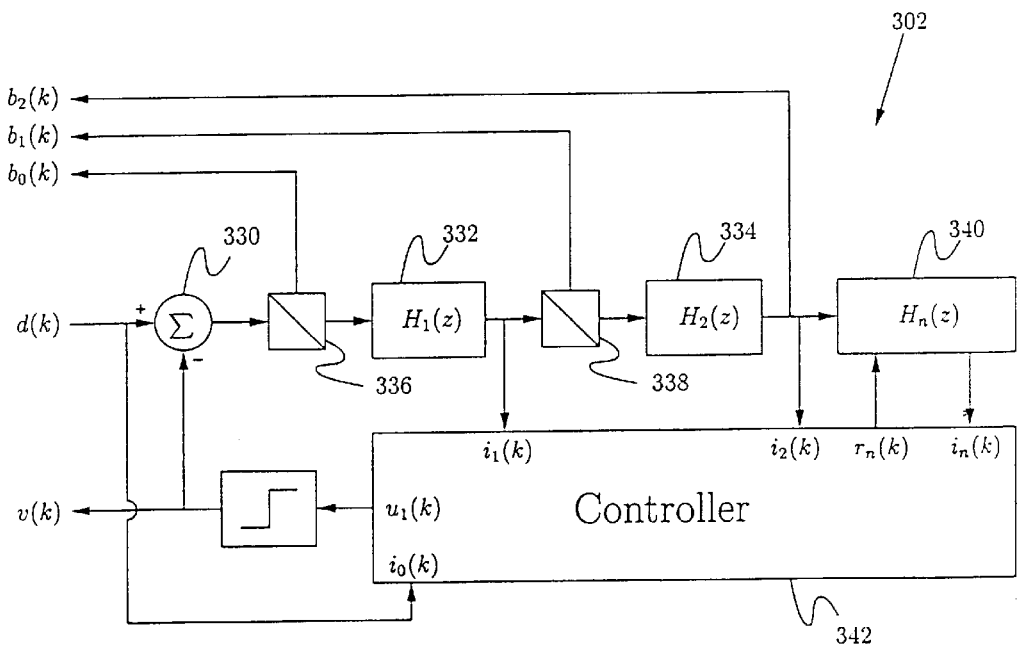
FIG. 12 shows how the separator is implemented in the second embodiment.

FIG. 12 shows a separator [302] which is a variant of the basic separator [202]. It is intended for use as the separator [102] in a D/A converter system, implemented according to the general structure [100]. It separates the digital input signal d(k) into a main digital signal v(k) and three digital compensation signals $b_0(k)$, $b_1(k)$, $b_2(k)$.

Description of the Second Embodiment

Only the separator [102], implemented as the separator [302] shown in FIG. 12, will be discussed. The remaining part of the system [100] is considered to be implemented according to the prior art.

The separator [302] is a generalization of the basic separator [202], which has already been discussed. Two blocks [336] [338] which will be called, "simple separators," are the only two new components. A simple separator is defined as a system that splits a signal into a most significant part and a least significant part. The most significant part is one or more of the input's most significant bits. The least significant part is the bits in the input which are not part of the most significant part. The sum of the most significant part and the least significant part is the input. A simple separator can be implemented by simple hardwiring. Notice the symbol which will be used to represent simple separators [336] [338].

A first simple separator [336] separates the output from the subtractor [330]. The most significant part is used as input to the first filter stage [332], while the least significant part is the first compensation signal $b_0(k)$.

A second simple separator [338] separates the output from the first filter stage [332]. The most significant part is used as input to the second filter stage [334], while the least significant part is the second compensation signal $b_1(k)$.

The output from the second filter stage [334] is the third compensation signal $b_2(k)$. The trailing filter section [340] is a representation of the third and fourth filter stages [236] [238] in the basic separator [202] and may consist of zero or many filter stages, depending on the order of the separator [302].

Operation of the Second Embodiment

If the two simple separators [336] [338] feed all the signals to the following filter stages, then the operation is identical to the operation of the previously described basic separator [202]. The separation of d(k), implemented by the separator [302], can be derived from a simple inspection of the circuit. Equation 13 describes the separation.

$$D(z)=[[B_2(z)H_2^{-1}(z)+B_1(z)]H_1^{-1}(z)]+B_0(z)+V(z) \quad (12)$$

$$=B_2(z)H_2^{-1}(z)H_1^{-1}(z)+B_1(z)H_1^{-1}(z)+B_0(z)+V(z) \quad (13)$$

Consequently, as desired for D/A converter systems of the general structure [100], the input d(k) is separated into a main signal v(k) and a set of compensation signals $b_0(k)$, $b_1(k)$, $b_2(k)$ of increasing magnitude and order of prescribed filtering.

The advantage of this separation, compared to separator used in the first embodiment, is that the largest compensation signal $b_2(k)$ can be of low to medium resolution. It can therefore be D/A converted by a mismatch-shaping D/A converter [108]. By doing so, the system [100] can be made quite immune with respect to nonlinearity errors.

Gain-Mismatch Errors

The largest signal $b_2(k)$ will be shaped if the separator [302] is of third or higher order (i.e., if the trailing filter section [340] is of at least first order). Due to the simple separation performed by the simple separators [336] [338], the two other compensation signals $b_0(k)$, $b_1(k)$ will be unshaped (like white noise). They will however be somewhat smaller than the large compensation signal $b_2(k)$; they will therefore not require the same order of shaping.

The advantage of the system is that it is very simple. However, the third, fourth, and fifth embodiment will show how significantly better separations can be obtained.

A Third Embodiment

A third embodiment is also implemented according to the general structure [100]. The digital input signal d(k) is separated into a two-level main digital signal v(k) and a plurality of first-order-shaped three-level compensation signals. The compensation signals are D/A converted with first-order two-unit-element mismatch-shaping D/A converters [108]. As a result, a nearly-ideal second-order shaping of both nonlinearity and gain-mismatch errors is obtained.

Because all compensation signals have a low resolution, the mismatch-shaping D/A converters [108] are simple to implement. The separator [402] is as simple to implement as a third-order delta-sigma modulator. It is, therefore, easy to implement a high-resolution D/A converter providing a very small Nyquist-band error signal which is second-order shaped.

Description of the Third Embodiment

The third embodiment is based on the general structure [100] shown in FIG. 9. The separator [102] is implemented as the separator [402] shown in FIG. 13. The separator [402] separates the digital input signal d(k) into a two-level main digital signal v(k) and P+1 three-level compensation signals $b_0(k), b_1(k), \ldots, b_P(k)$. The main digital signal v(k) is D/A converted by a simple two-level D/A converter [104]. The compensation signals are D/A converted by three-level first-order mismatch-shaping D/A converters [108] and filtered by analog filters [110] with transfer functions $\widehat{H}_{B_i}(z)=(1-z^{-1})$.

Analog Circuits

According to the prior art, analog filters [110] with the transfer function $(1-z^{-1})$ can be almost ideally implemented when switched-capacitor circuit techniques are used. Accordingly, it is assumed that all analog parts [104] [106] [108] [110] [112] [114] of the system [100] are implemented as switched-capacitors circuits. Further details will be discussed in the description of a fourth embodiment.

The Separator

Figure 13:
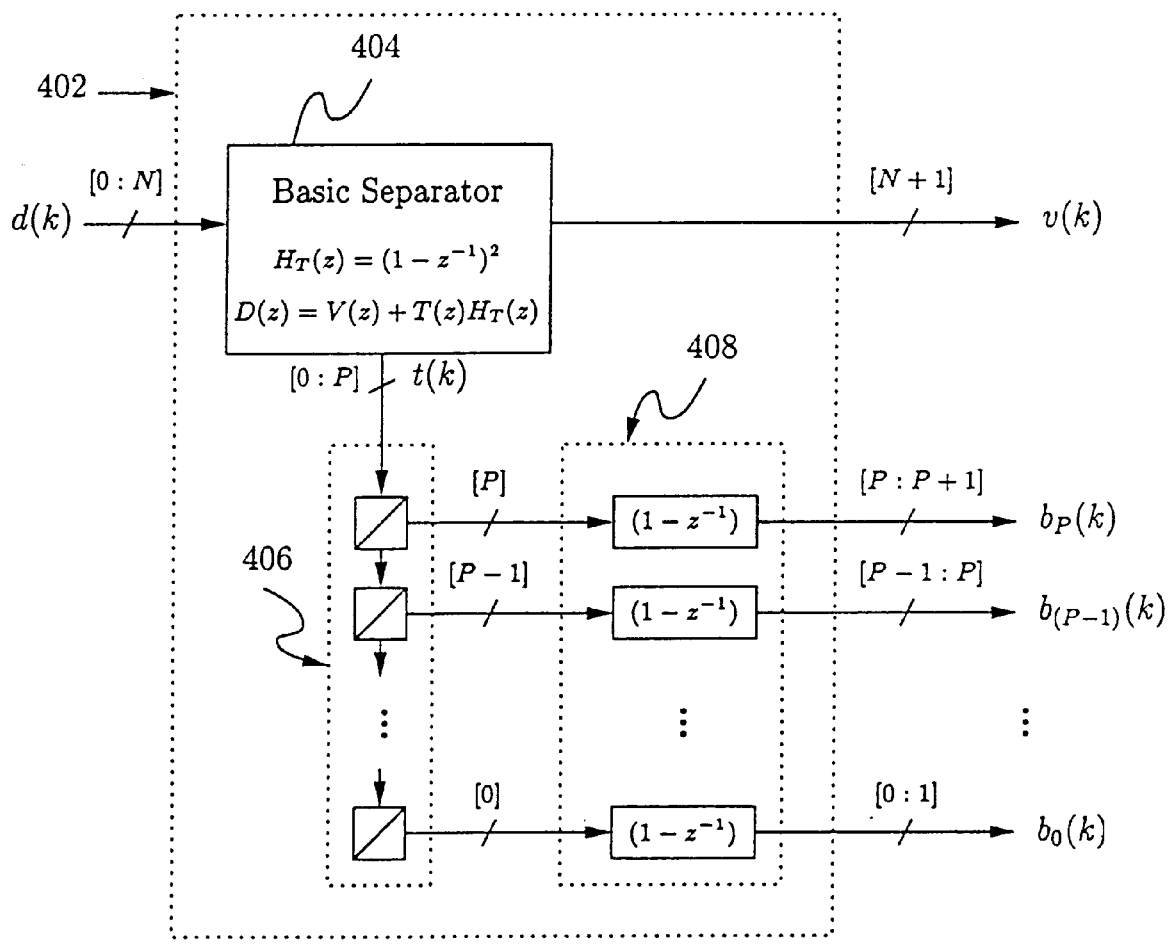
FIG. 13 shows how the separator is implemented in the third embodiment.

FIG. 13 shows how the separator [402] is implemented. A first sub-separator [404] separates the input signal d(k) into the main digital signal v(k) and a temporary (meaning "intermediate") signal t(k). The first sub-separator [404] is implemented as the basic separator [202], shown in FIG. 11 and discussed above. The temporary signal t(k) in FIG. 13 is the output signal C2 (k) from the second filter stage [234] in FIG. 11. The first sub-separator [404] is of second order (i.e., the trailing filter stages [236] [238] are omitted). The quantizer [242] is a two level-device.

The temporary signal t(k) is separated into its individual bits by a cascade of simple separators [406]. Each bit of the temporary signal t(k) is individually filtered by an array of digital filters [408]; each filter [408] has the transfer function $(1-z^{-1})$. The digital compensation signals $b_0(k)$, $b_1(k)$, ... $b_P(k)$ are thereby generated as the first-order difference of the individual bits of the temporary signal t(k).

Operation of the Third Embodiment

The operation of the general structure [100] and the basic separator [202], implementing the first sub-separator [404], has already been described. The following will evaluate the suppression of the nonlinearity and gain-mismatch errors.

First-Order Shaped Digital Compensation Signals

The temporary signal t(k) is a wide-band signal. Separating it bitwise will generate a number of wide-band signals. However, due to the first-order-difference filtering performed by the digital filters [408], the digital compensation signals $b_0(k)$, $b_1(k)$, ... $b_P(k)$ will be first-order shaped.

Suppression of Non-Linearity Errors

The main D/A converter [104] is inherently linear because it is a two-level device. It will therefore, at most, cause an offset. The other nonlinearity errors are defined as $$\sum_{i=0}^{N} M_i(z)\hat{H}_{B:i}(z).$$

Because the D/A converters [108] are first-order mismatch-shaping, the element-mismatch signals mi(k) will be first-order shaped. The subsequent filtering, performed by analog filters [110], will further first-order suppress the errors in the signal band. Consequently, the nonlinearity errors will all be second-order shaped.

Suppression of Gain-Mismatch Errors

The gain-mismatch errors are defined as $$\sum_{i=0}^{N} B_i(z)\left[\hat{K}_i \hat{H}_{B:i}(z) - K H_{B:i}(z)\right].$$

The mismatch between a good switched-capacitor implementation of a first-order-difference filter and its digital equivalent can be shown to be inversely proportional to an RC-time constant (defined by the capacitors and the leakage current through the insulating material between the capacitor plates) and the systems operating frequency. Unless the technology is very poor or the surrounding temperature is very high, this will not be a problem. The gain-mismatch errors can, therefore, be approximated by $$\sum_{i=0}^{N} B_i(z) H_{B:i}(z)\left[\hat{K}_i - K\right].$$

Because the compensation signals $b_i(k)$ are all first-order shaped, the gain-mismatch errors will be the second-order-shaped.

Evaluation of the Third Embodiment

The third embodiment is simple and it will function very well. It is a high-performing second-order mismatch-shaping D/A converter which can be implemented in a basic technology. However, as will be explained, there is still room for improvement.

Improving the Performance

Both nonlinearity and gain-mismatch errors will be proportional to the magnitude of the compensation signal to which they refer. If the technology offers −60 dB relative matching, then the Nyquist-band power content of these errors will be approximately 60 dB below the maximum magnitude of the compensation signal to which they refer. Additional suppression is obtained by means of shaping and oversampling (as illustrated in FIG. 6).

Because of their low power contents, some of the least significant compensation signals can be D/A converted by simple non-mismatch-shaping D/A converters without degrading the performance. The smallest compensation signals may not even have to be implemented.

Unfortunately, if a compensation signal is, say, ten times larger than full-scale output, the −60 dB Nyquist-band power contents will be relative to that large level. Consequently, to obtain a 100 dB signal-to-noise ratio, a 60 dB signal-band suppression, instead of a 40 dB signal-band suppression, will have to be obtained by means of oversampling and shaping. FIG. 6, with respect to second-order shaping, reveals that about 30 times oversampling will be required instead of just 10 times.

Compared to the prior art, this is still a great design. A fourth embodiment will, however, show how the maximum magnitude of the compensation signals can be made even less than twice the full-scale output magnitude.

A Fourth Embodiment

Figure 14:
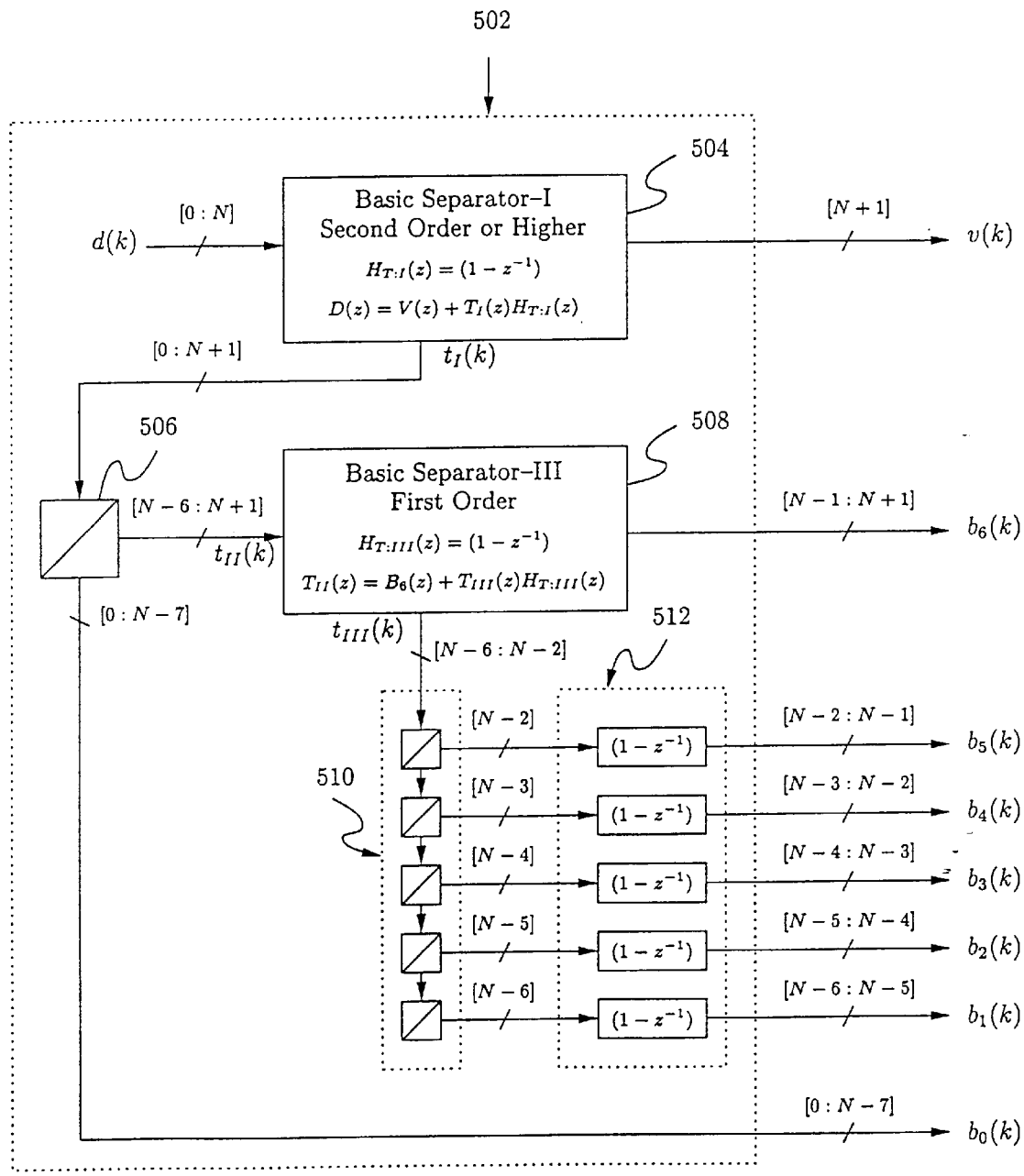
FIG. 14 shows how the separator is implemented in the fourth embodiment.

A fourth embodiment, FIG. 14, is also based on the general structure [100] shown in FIG. 9. It is an embodiment in which all large error signals are second-order shaped. The advantage of the fourth embodiment, compared to the third, is that the maximum magnitude of the compensation signals is approximately four times smaller.

Small compensation signals can be obtained with the third embodiment simply by increasing the resolution of the main digital signal v(k). However, to maintain a second-order shaping of all large error signals, the main D/A converter [104] would be required to be second-order mismatch-shaping. The fourth embodiment avoids this complication.

How to Avoid Large Compensation Signals

It is assumed that the first step of the separation will be performed by a basic separator [202], as shown in FIG. 11. The sum of the filtered compensation signals compensates for the difference between the digital input signal d(k) and the main digital signal v(k). Analysis shows that the peak-to-peak value of this difference, the signal $c_0(k)$ in FIG. 11, will be at least twice the minimum step size of the quantizer [242]. If the quantizer [242] is designed as a two-level device, the magnitude of $C_0(k)$ will be at least twice as large as the maximum magnitude of the digital input signal d(k) for which the basic separator [202] is stable.

The above result refers to the sum of the filtered compensation signals $B_i(z)H_{B:i}(z)$. It does not necessarily apply to the compensation signals themselves. Simulations of basic separators [202], using linear controllers [240] which are known to be reasonably good, show that the output $c_1(k)$ from the first filter stage [232] typically will have a peak-to-peak value which is comparable to the step size of the quantizer [242]. Also, it is a general property that the level of the signal increases as it propagates down the chain of filters [234] [236] [238]. Consequently, to minimize the magnitude of the compensation signals, they should be generated as a sub-separation of the output of the first filter stage [232].

Overflow Must be Avoided

It is important and necessary to avoid overflow in the filters that characterizes the operation of the basic separator [202] (i.e., in the first filter stage [232] if cl(k) is used as the output). Overflow is unacceptable because it will generate spikes in the analog output n(k)=a(k). The output $c_1(k)$ from the first filter stage [232] and the outputs from the other filter stages [234] [236] [238] are "stochastically" distributed. When a well-designed linear controller [240] is used, the distribution of $c_1(k)$ will have an upper and a lower boundary which are much more abrupt than those of a Gaussian distribution. Overflow can therefore be efficiently avoided by designing the data bus representing $c_1(k)$ to be sufficiently wide. It is, however, an expensive approach; the chip-area is thereby increased and the performance may be degraded.

For a first-order basic separator [202], it can be assured that the peak-to-peak value of $c_1(k)$ will be the step size of the quantizer [242]. By designing the controller [240] with emphasis only on $i_1(k)$, the same relationship can be obtained for basic separators [202] of any order. However, to obtain a reasonable shaping of cl(k), the state of the other filter stages [234] [236] [238] will have to be taken into account. The magnitude of $c_1(k)$ will increase accordingly.

For basic separators [202] of almost any order, a well-designed linear controller [240] will keep the peak-to-peak value of $c_1(k)$ comparable to the step size of the quantizer [242]—most of the time. From time to time, there will be a spike in the signal $c_1(k)$.

Nonlinear Controllers

Large spikes in $c_1(k)$ can be avoided by designing the controller [240] such that, if overflow is about to occur (can be determined by calculating $c_1(k)$ in advance), v(k) is chosen to make the next value of $c_1(k)$ smaller than the previous. This effect can always be obtained, but it is likely to cause stability problems in the subsequent filter stages [234] [236] [238]. Reset, saturation, or other techniques may be required to restore stable operation. By avoiding spikes in $c_1(k)$, the signal may be represented in a narrower range without risking spikes in n(k).

The downside, for avoiding spikes in n(k) in this manner, is a higher signal-band content of gain-mismatch errors (because $c_1(k)$ is less shaped). The non-overflow range of $c_1(k)$ should, therefore, be designed wide enough to make such operations a rare event (for instance, once every 10,000 samples, as an average).

The overall conclusion is that the more cleverly the controller [240] is designed, the lower the magnitude of $c_1(k)$ can be made without sacrificing the suppression of gain-mismatch errors in the signal band.

General Description of the Fourth Embodiment

The fourth embodiment, FIG. 14, is implemented according to the general structure [100] shown in FIG. 9. The separator [102] separates the digital input signal d(k) into the two-level main digital signal v(k) and seven compensation signals $b_0(k)$, $b_1(k)$, $b_2(k)$, $b_3(k)$, $b_4(k)$, $b_5(k)$, $b_6(k)$. These eight signals are D/A converted by D/A converters [104] [108] and subsequently filtered by analog filters [106] [110]. The main analog filter [106] is a simple signal path (i.e., no signal conditioning is performed). All the compensation signals are filtered in the analog domain by filters [110] having the transfer function $(1-z^{-1})$. The signals o(k), $p_0(k)$, $p_1(k)$, $p_2(k)$, $p_3(k)$, $p_4(k)$, $p_5(k)$, $p_6(k)$ from the analog filters [106] [110] are added to form the analog estimation signal n(k). If required, the analog estimation signal n(k) may be filtered by an analog low-pass filter [114].

General Operation of the Fourth Embodiment

The operation is very similar to the third embodiment. The second to the seventh compensation signal $b_1(k)$, $b_2(k)$, $b_3(k)$, $b_4(k)$, $b_5(k)$, $b_6(k)$ are generated as first-order-shaped signals. The first compensation signal $b_0(k)$ is not shaped, but it can be made as small as desired.

By first-order filtering the compensation signals with analog switched-capacitors filters [110], the gain-mismatch errors from all large digital compensation signals are made second-order-shaped. The gain-mismatch error from the first digital compensation signal $b_0(k)$ will be small and first-order-shaped.

By employing first-order mismatch-shaping D/A converters [110], the nonlinearity errors from all large compensation signals are made second-order-shaped. The first digital compensation signal $b_0(k)$ is D/A converted with a scaled-element D/A converter; this nonlinearity error will be small and first-order-shaped.

The advantage of this embodiment is that the compensation signals are smaller than in the third embodiment. This reduction is obtained by designing the separator [502] as described below.

Description of the Separator Used in the Fourth Embodiment

The separator [102] is implemented as the separator [502] illustrated in FIG. 14. The separator [502] consists of a first sub-separator [504], a second sub-separator [506], a third sub-separator [508], a fourth sub-separator [510], and an array of digital filters [512].

The first sub-separator [504] is a second-order basic separator [202]. It separates the digital input signal d(k) into the main digital signal v(k) and a first temporary signal $t_I(k)$. The first temporary signal $t_1(k)$ is the output from the basic separator's [202] first filter stage [232]. The operation of the first sub-separator [504] is expressed by Equation 14:

$$D(z)=V(z)+T_I(z)(1-z^{-1}) \qquad (14)$$

The second sub-separator [506] is a simple separator separating the first temporary signal $t_I(k)$ into a second temporary signal $t_{II}(k)$ and the first digital compensation signal $b_0(k)$. Let N define the number of the most significant bit of the digital input signal d(k). The second temporary signal $t_{II}(k)$ consists of the most significant bits of the first temporary signal $t_I(k)$, starting from bit number N−6. The first digital compensation signal $b_0(k)$ consists of the N−6 least significant bits of $t_I(k)$ (i.e., bits number 0 to N−7).

The third sub-separator [508] is a first-order basic separator [202]. It separates the second temporary signal $t_{II}(k)$ into a third temporary signal $t_{III}(k)$ and the seventh digital compensation signal $b_6(k)$. The third temporary signal $t_{III}(k)$ is the output from the basic separator's [202] first and only filter stage [232]. The operation of the third sub-separator [508] is expressed by Equation 15:

$$T_{II}(z)=B_6(z)+T_{III}(z)(1-z^{-1}) \qquad (15)$$

The fourth sub-separator [510] is a cascade of simple separators separating the third temporary signal $t_{III}(k)$ into its individual bits. The bits of the third temporary signal $t_{III}(k)$ are individually filtered by an array of digital filters [512]. Each filter in the array [512] has the transfer function $(1-z^{-1})$. The three-level signals generated by these filters

[512] are the second, third, fourth, fifth, and sixth digital compensation signal $b_1(k)$, $b_2(k)$, $b_3(k)$, $b_4(k)$, $b_5(k)$.

Operation of the Separator Used in the Fourth Embodiment

The sum of the second to the sixth digital compensation signal $b_1(k)$, $b_2(k)$, $b_3(k)$, $b_4(k)$, $b_5(k)$ will equal the third temporary signal $t_{III}(k)$, filtered by a filter with the transfer function $(1-z^{-1})$. This is described by Equation 16:

$$T_{III}(z)(1-z^{-1}) = B_1(z) + B_2(z) + B_3(z) + B_4(z) + B_5(z) \qquad (16)$$

By combining equations 16 and 15, it can be derived that the sum of the first to the sixth compensation signals will equal the second temporary signal $t_{II}(k)$. This is described by Equation 17:

$$T_{II}(z) = B_1(z) + B_2(z) + B_3(z) + B_4(z) + B_5(z) + B_6(z) \qquad (17)$$

Taking the simple separation performed by the second sub-separator [506] into account, it can be derived that the sum of all the digital compensation signals will equal the first temporary signal $t_i(k)$. This is described by Equation 18:

$$T_I(z) = B_0(z) + B_1(z) + B_2(z) + B_3(z) + B_4(z) + B_5(z) + B_6(z)$$

By combining equations 18 and 14 it becomes evident that the separator [502] performs the separation described by the two equivalent Equations 19 and 20:

$$D(z) = V(z) + \sum_{i=0}^{6} B_i(z)(1-z^{-1}) \qquad (19)$$

$$d(k) = v(k) + \sum_{i=0}^{6} (b_i(k) - b_i(k-1)) \qquad (20)$$

The Compensation Signals are Shaped

The first temporary signal $t_I(k)$ is first-order shaped. This is a consequence of the property that the output from the second filter stage [234] integrating $t_I(k)$ remains bounded.

By referring the gain-mismatch of the D/A conversions of $b_0(k)$ and $t_{II}(k)$ to $b_0(k)$, it can be shown that the second temporary signal $t_{II}(k)$ is first-order shaped.

The simple separation performed by the second sub-separator [506] will not shape the first compensation signal $b_0(k)$. However, by design of the sub-separator [506], $b_0(k)$ can be made as small as desired. The only-first-order-shaped errors in the analog estimation signal $n(k)$ can thereby be muted to any level.

Due to the filtering in the digital filters [512], the second to the sixth digital compensation signals $b_1(k)$, $b_2(k)$, $b_3(k)$, $b_4(k)$, $b_5(k)$ are first-order shaped.

The seventh compensation signal $b_6(k)$ is the difference between $t_{II}(k)$ and $$\sum_{i=1}^{5} b_i(k),$$

which are both first-order shaped. Consequently, the seventh compensation signal $b_6(k)$ is first-order shaped as well.

The Compensation Signals are Small

The first temporary signal $t_I(k)$ is the output from the first filter stage [232] of a second-order basic separator [202]. The used linear controller [240] will be able to keep the peak-to-peak value of this signal at 1.5 times the step size of the two-level quantizer [242]. As discussed previously, by including nonlinearities in the controller [240], this range can be assured at 100% probability even for full-scale inputs. To keep it simple, this embodiment allows a very small probability for spikes in the output. While maintaining the input $d(k)$ within 90% of full-scale, lengthy simulations have not provoked a single spike.

The magnitude of the second temporary signal $t_{II}(k)$ will be slightly lower than the magnitude of the first temporary signal $t_I(k)$. The magnitude of the seventh and largest compensation signal $b_6(k)$ will be the same as the magnitude of the second temporary signal $t_{II}(k)$. Therefore, in this embodiment, the peak-to-peak value of the largest compensation signal will be 1.5 times the step size of the two-level quantizer [242] used in the first sub-separator [504].

The magnitude of the other compensation signals will be equal to, or smaller than, the step size of the quantizer [242] used in the third sub-separator [508]. The low magnitude is obtained by designing the third sub-separator of first order.

Combining the above statements, it will be understood why the quantizer [242] employed in the 5 third sub-separator [508] can be designed as a seven-level device. The chosen levels are $-1.5, -1.0, -0.5, 0, 0.5, 1.0, 1.5$ times $2^N$. These levels are based on the levels of the main digital signal $v(k)$: $-2^N$ and $2^N$.

Detailed Description of How to Implement the Separator

Figure 15:
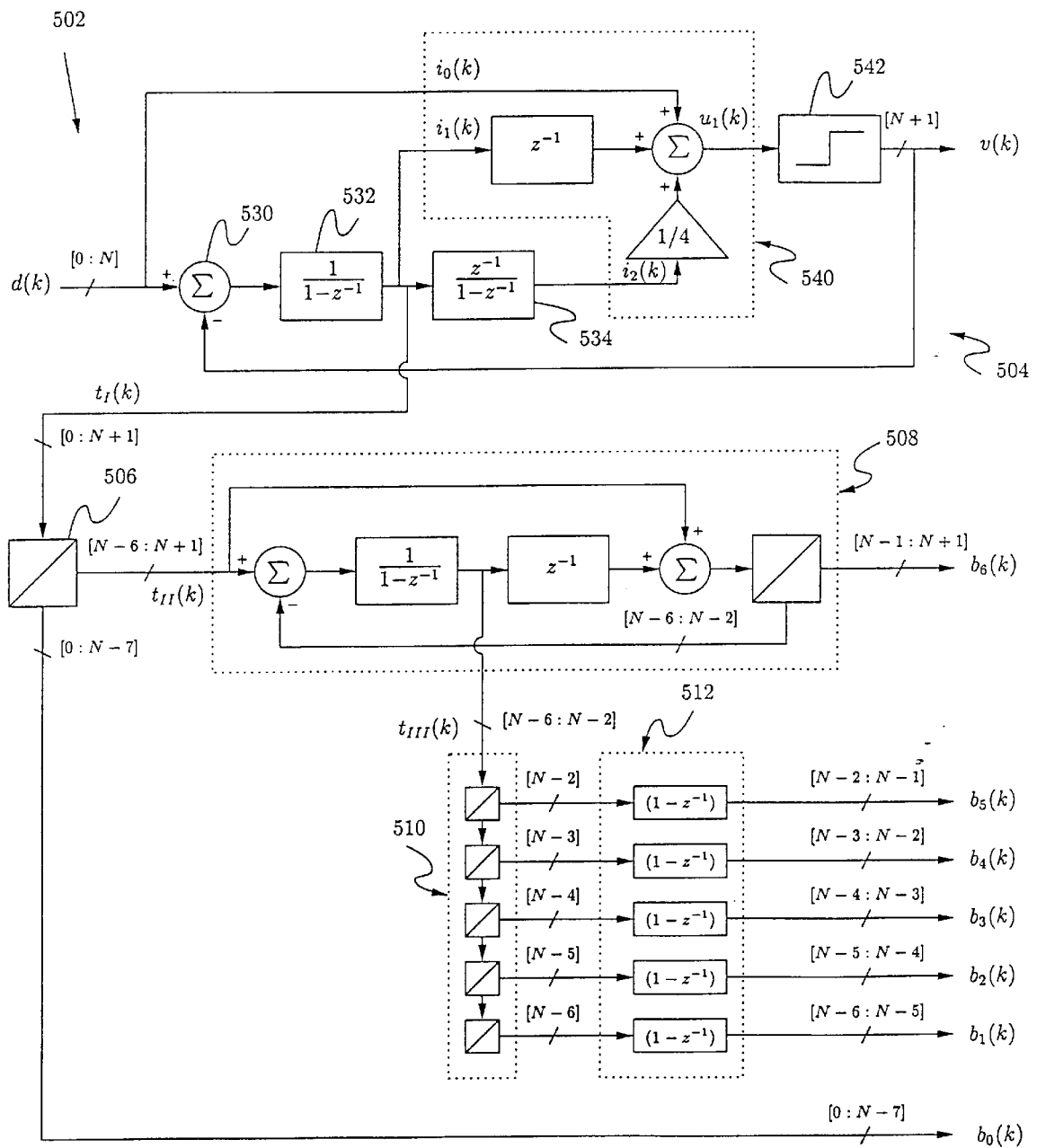
FIG. 15 shows in detail how the separator in the fourth embodiment can be implemented.

FIG. 15 shows in detail how the separator [502] can be implemented. It is assumed that a two's complement coding is used to represent the signals. The range of the input signal $d(k)$ will, therefore, be $2^N$ to $2^N-1$. As mentioned, to prevent spikes in the analog estimation signal $n(k)$, the input should be slightly smaller.

The First Sub-Separator

The first sub-separator [504] is implemented as a basic separator [202]; the general topology is illustrated in FIG. 11. The separator is of second order (i.e., the third [236] and fourth [238] filter stages are omitted). The first filter stage [532] has the transfer function $$\frac{1}{1-z^{-1}}$$

(non-delaying integrator). The second filter stage [534] has the transfer function $$\frac{z^{-1}}{1-z^{-1}}$$

delaying integrator).

The employed controller [540] is linear. It generates only one output, the signal $\mu_1(k)$ fed to the quantizer [542]. The output $\mu_1(k)$ is the digital input signal $d(k)$ plus the delayed output from the first filter stage [532] plus a quarter of the output from the second filter stage [534].

The quantizer [542] is a two-level device. Its output $v(k)$ will always have the same polarity as the input $\mu_1(k)$. The two possible output values are $2^N$ to $2^N-1$.

It is possible, by redesigning the whole system, to choose the quantizer's [542] levels as e.g. $-1.25 \cdot 2^N$ and $1.25 \cdot 2^N$, thereby allowing the input $d(k)$ to utilize the full range $-2^N$ and $2^N$ without increasing the risk of spikes in the analog estimation signal $n(k)$.

Stability of the First Sub-Separator

For a delta-sigma modulator design, the designed controller [540] will usually be considered as too conservative. To obtain better suppression of the quantization noise, a greater fraction of the output from the second filter stage can be included in $\mu_1(k)$. Suppression of the quantization noise is, however, not the only concern for this type of D/A converter system. The suggested design reflects that an equally important design goal, to obtain both small and shaped digital compensation signals, is taken into consideration.

The Third Sub-separator

Figure 16:
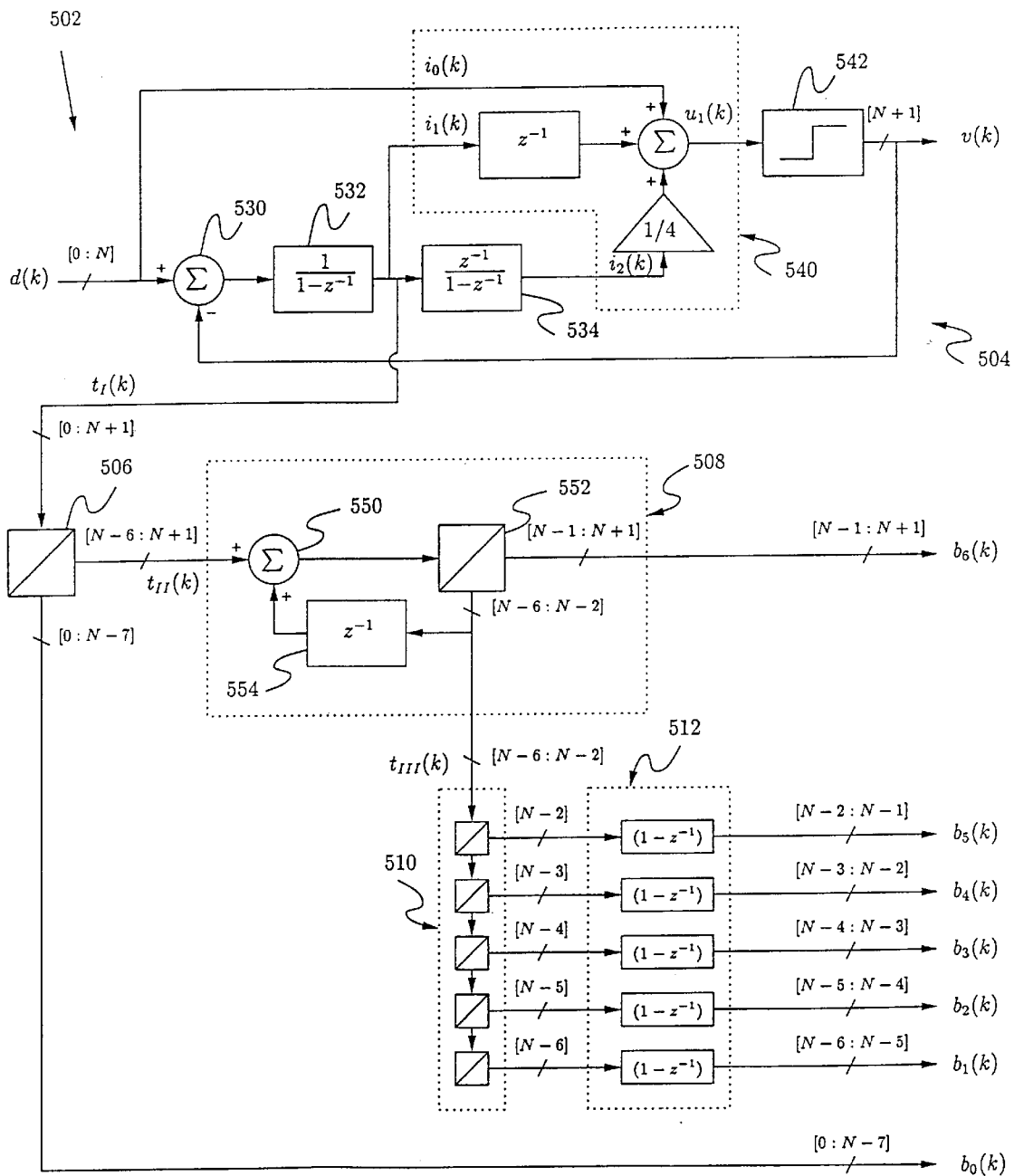
FIG. 16 shows in detail how the separator in the fourth embodiment can be implemented even simpler.

FIG. 15 shows how the third sub-separator [508] can be implemented according to the general topology for basic separators shown in FIG. 11. This first order basic separator, however, has an equivalent which is simpler to implement. FIG. 16 shows this equivalent implementation.

In the equivalent implementation, the third sub-separator [508] consists of an adder [550], a simple separator [552], and a one-sample-of-delay block [554]. The adder [550] sums the second temporary signal $t_{II}(k)$ (the sub-separator's [508] input signal) and the output from the delay block [554]. The simple separator [552] separates the output from the adder [550] into the seventh compensation signal $b_6(k)$ and the third temporary signal $t_{III}(k)$. The seventh compensation signal $b_6(k)$ consists of the three most significant bits (bits number N−1 to N+1) of the output from the adder [550]. The third temporary signal $t_{III}(k)$ consists of the remaining bits (bits number N−6 to N−2) of the output from the adder [550]. The delay block [554] is connected from the third temporary signal $t_{III}(k)$ to the adder [550].

The three bits representing the seventh compensation signal $b_6(k)$ will have a code "100" which should not occur during normal operation. The D/A converter converting this signal can therefore be a six-unit-elements D/A converter.

Implementation of D/A Converters and the Analog Circuitry

Figure 17:
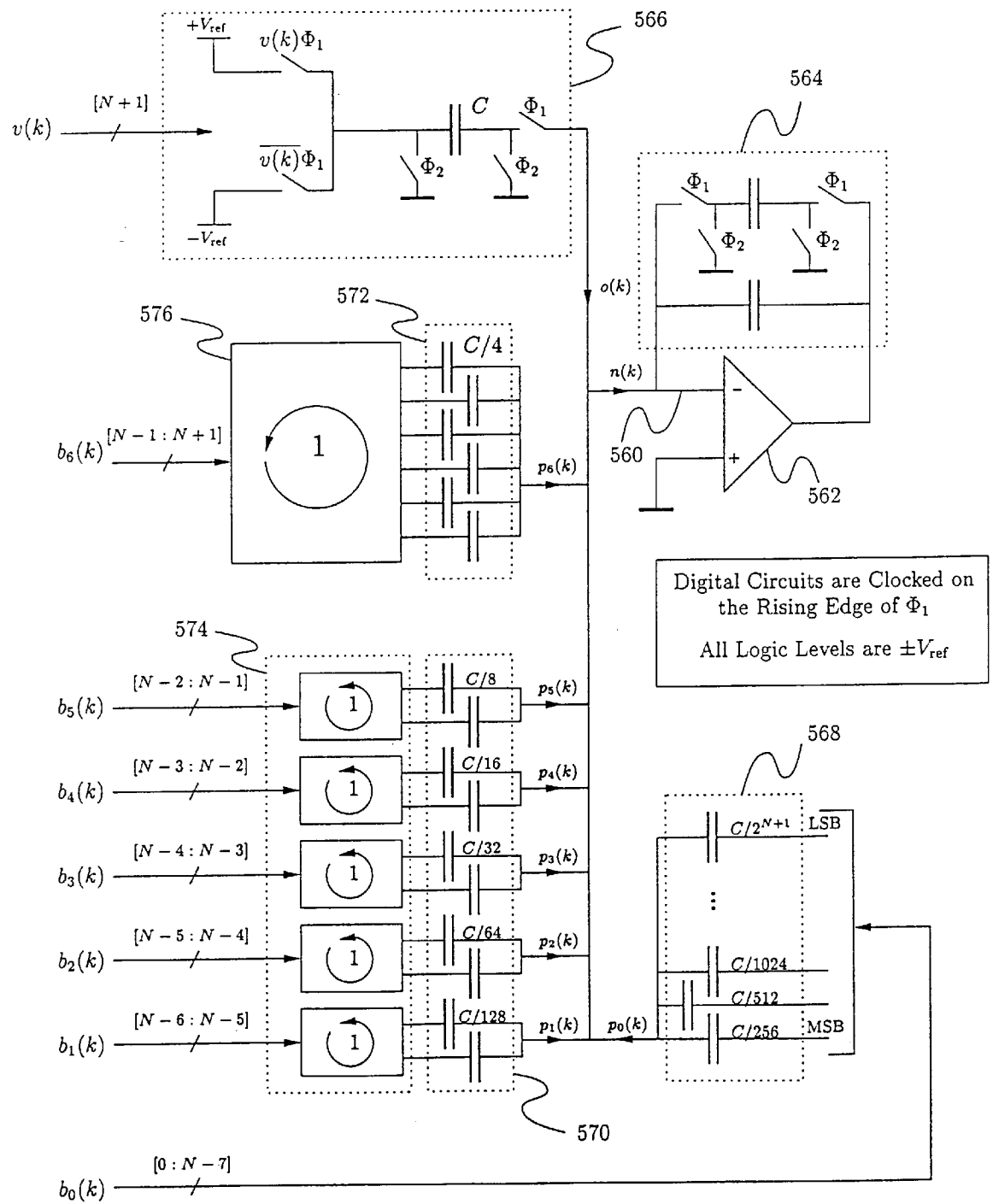
FIG. 17 shows in detail how the internal D/A converters and analog switch-capacitor filters, used in the fourth embodiment, can be implemented.

FIG. 17 shows a switched-capacitor implementation of the D/A converters [104] [108] and the analog circuitry [110] [112] [114] in the general structure shown in FIG. 9. In conjunction with the described separator [502] it is a full implementation of a D/A converter system according to this invention. Note that the third embodiment can be implemented similarly.

Description of the D/A Converters and the Analog Circuitry

A main D/A converter [566] receives the main digital signal v(k) as the input. For each sample, the main D/A converter [566] generates, as the output, a charge o(k) supposedly proportional to v(k). The output from the main D/A converter [566] is connected to a common node [560] into which charge can be dumped. The common node [560] is connected to the inverting input terminal of an operational amplifier (opamp) [562]. The non-inverting input terminal of the opamp [562] is connected to ground. A feedback network [564] is connected between the inverting input terminal and the output terminal of the opamp [562]. The shown feedback network [564] is a switched-capacitor realization of an RC-network, thereby making it possible to dump a continuous flow of charge into the common node [560].

The D/A conversion and filtering of the first compensation signal $b_0(k)$ is realized by an array of scaled capacitors [568]. The top plate of each of these capacitors [568] is connected to the common node [560]. The signals, which represent each one bit of the first compensation signal $b_0(k)$, are connected to the bottom plates of the respectively scaled capacitors [568].

The second to the sixth compensation signal $b_1(k)$, $b_2(k)$, $b_3(k)$, $b_4(k)$, $b_5(k)$ are D/A converted and filtered by an array of three-level DWA coders [574] driving an array of scaled pairs of capacitors [570]. Each DWA coder [574] has two output terminals which are connected to the bottom plates of a pair of supposedly identical capacitors [570]. The top plates of all the capacitors [570] are connected to the common node [560].

The seventh compensation signal $b_0(k)$ is D/A converted and filtered by a seven-level DWA coder [576] driving an array of six supposedly identical capacitors [572]. The DWA coder [576] has six output terminals connected to the bottom plates of the six capacitors [572]. The top plates of the capacitors [572] are all connected to the common node [560].

Operation of the D/A Converters and the Analog Circuitry

Implementing an analog circuit is a delicate matter. The success of an implementation will depend on how well it corresponds to the mathematical representation it was described by in the design process. A D/A converter system according to this invention may be susceptible to non-idealities of the circuitry adding the analog signals, and to non-idealities of the analog filters shaping the compensation signals. This embodiment offers a nearly-ideal performance in both aspects.

Summation of the Analog Signals

The main analog signal o(k) and the analog compensation signals $p_6(k)$, $p_5(k)$, $p_4(k)$, $p_3(k)$, $p_2(k)$, $p_1(k)$, $p_0(k)$ are represented by charge transport. Simply by feeding them to one common node [560], they will be summed to form the analog estimation signal n(k). This summation will be ideal for all practical purposes.

The Output Stage

The potential of the common node [560], is maintained at virtual-ground by the opamp [562]. The charge-transfer representation of the analog estimation signal n(k) is converted to a voltage representation by the feedback network [564]. The feedback network [564] will preferably also provide a filter function to suppress out-of-the-signal-band errors. Those skilled in the art will know how to design this feedback-network [564].

The Main D/A Converter

The main D/A converter [566] will, at the rising edge of a first clock signal $\Phi_1$, dump a charge o(k) into the common node [560]. This charge will be either plus or minus a reference voltage $V_{ref}$ times a reference capacitance C. The polarity of the dumped charge o(k) will be the same as the polarity of the main digital signal v(k). This D/A converter [566] should be designed carefully. Good design techniques can be found in the prior art.

Differentiating D/A Converters

A nearly-ideal analog first-order-difference filtering of the compensation signals is obtained by implementing the D/A converters [108] and the analog filters [110] as non-reset capacitors [572] [570] [568]. Because the analog compensation signals are represented by charge transport, the only non-shaped errors that can occur are the leakage currents flowing from one capacitor plate to the other. This is normally not a problem in modern technologies.

Consider as an example the conversion and filtering of the first digital compensation signal $b_0(k)$. It is assumed that all logic signals are clocked at the rising edge of the first clock signal $\Phi_1$, and that they have ideal logic levels of plus and minus $V_{ref}$ (the logic signals should be buffered to obtain these values before they are used to control the capacitors). Each bit in the signal $b_0(k)$ is treated individually (i.e. $b_0(k)$ is converted by a non-mismatch-shaping scaled-element D/A converter), so the example can be narrowed to consider just one of these bits. The signal representing the bit of consideration is connected directly to the bottom plate of a capacitor C* [568], the top plate being connected to the common node [560]. At the rising edge of the first clock signal $\Phi_1$, a charge may be dumped into the common node [560]. If the signal, representing the bit of consideration, is experiencing a transient from $-V_{ref}$ to $+V_{ref}$, then the charge $2V_{ref}C^*$ will be dumped. If the signal is experiencing a transient from $+V_{ref}$ to $-V_{ref}$, then the charge $-2V_{ref}C^*$ will be dumped. If the signal does not change from the previous sample, then no charge will be dumped. Accordingly, the dumped charge will be proportional to the first order derivative of the values represented by the bit of consideration.

To design the system, it is necessary to make the proportionality have the correct factor. The levels that can be represented by bit number P are 0 and $2^P$. The possible values of the first order difference are therefore $-2^P$, 0, and $2^P$. The size of the capacitor C used in the main D/A converter [566] sets the reference for the system's [100] number-to-charge conversion as described by $V_{ref} C = 2^N$. This leads to the following general result which is valid for bit number P:

$$C^* = 2^{(P-N-1)} C \qquad (21)$$

The ideal capacitance of the capacitor connected to the most significant bit of $b_0(k)$ (bit number N-7) is therefore $2^{N+1-(N-7)} = 256$ times smaller than the reference capacitance C.

Three-Level Mismatch-Shaping D/A Converters

The second to the sixth compensation signal, $b_1(k)$, $b_2(k)$, $b_3(k)$, $b_4(k)$, $b_5(k)$ are D/A converted by first-order mismatch-shaping D/A converters. Each of these signals can have three values: $-2^P$, 0, $2^P$. Because they are subsequently differentiated, a constant value can be added: 0, $2^P$, $2^{P}+1$. It makes no difference, but clearly shows that two-unit-elements D/A converters can be used to D/A convert these signals. To obtain the required filtering, these D/A converters are implemented as pairs of supposedly identical capacitors [570] which are not being reset. The required capacitance of each capacitor in each of these pairs [570] can be determined from Equation 21 where P is the number of the least significant bit in the respective compensation signal.

To obtain the required mismatch-shaping, the capacitors [570] are controlled by three-level DWA coders [574]. Each DWA coder [574] has two output terminals, each providing either the potential $+V_{ref}$ or the potential $-V_{ref}$. The number of output terminals having the potential $+V_{ref}$ will be proportional to the compensation signal, represented by 0, $2^P$, $2^{P+1}$, which it converts. Besides the thermometer coding, the DWA coders [574] will interchange the output terminals each time only one terminal has a high potential. The described algorithm is a member of the family of Data-Weighted-Averaging algorithms. Such algorithms are well documented in the literature.

Seven-Level Mismatch-Shaping D/A Converters

The seventh compensation signal be(k) is also D/A converted by a first-order mismatch-shaping D/A converter. When a constant is added, the signal has seven possible levels: 0, $2^{N-1}$, $2 \cdot 2^{N-1}$, $3 \cdot 2^{N-1}$, $4 \cdot 2^{N-1}$, $5 \cdot 2^{N-1}$, $6 \cdot 2^{N-1}$. The signal is therefore suitable for D/A conversion with a six-unit-elements DWA mismatch-shaping D/A converter. In full analogy to the previous discussion, the conversion and first-order-difference filtering is performed by six non-reset capacitors [572], each with a quarter of the reference capacitance. These six capacitors [572] are controlled by a seven-level DWA coder [576] which is a generalization of the described three-level DWA coders [574]. The generalization can be performed in many ways; U.S. Pat. Nos. 5,404,142 and 5,221,926 describe two.

Simulation Results

The fourth embodiment has been simulated, and the results are found to agree with the theoretical prediction.

To be able to clearly illustrate that the large errors are second-order shaped, the fourth embodiment has also been simulated in a version where the second sub-separator [506] forms the second temporary signal $t_{II}(k)$ as the 12 most significant bits of the first temporary signal ti(k). A 0.1% (three-sigma) relative matching was assumed (for large geometries). A 90%-of-full-scale sawtooth was used as the digital input signal d(k).

Figure 18:
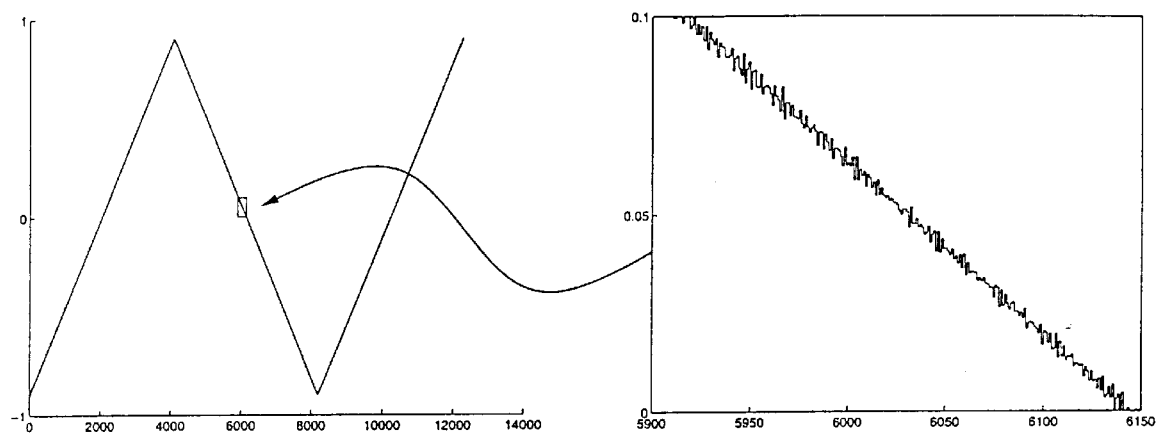
FIG. 18 shows the output waveform from the fourth embodiment when a sawtooth is applied as the input signal.
Figure 19:
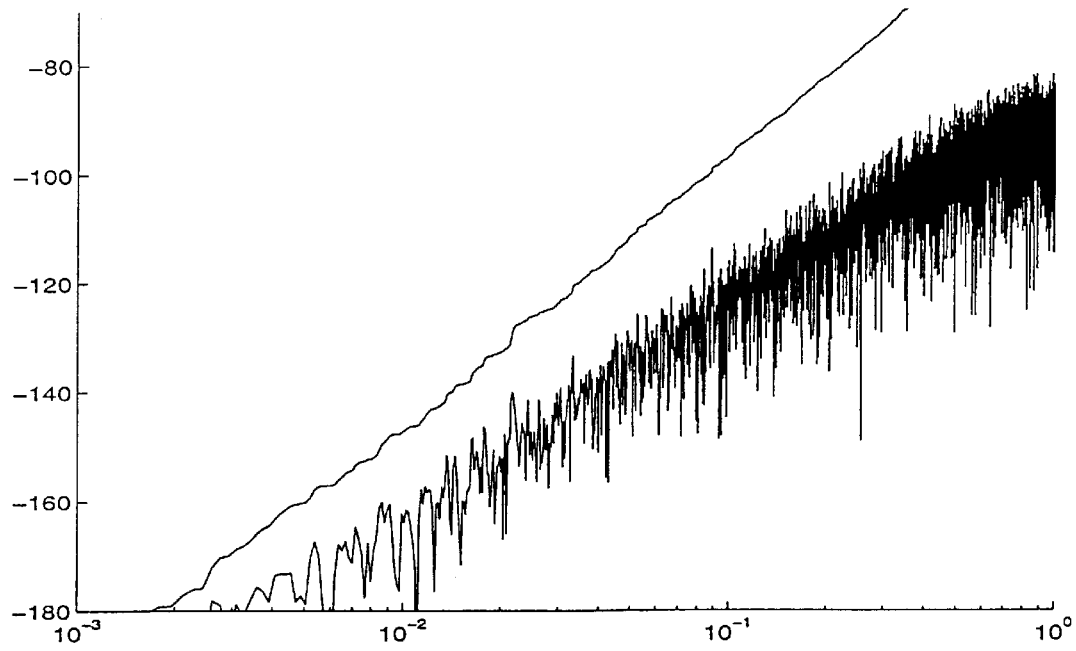
FIG. 19 shows the power-density spectrum (Fast-Fourier Transform) of the error signal in the fourth embodiment (data comes from the same simulation as in FIG. 18).

The two plots in FIG. 18 show the estimation signal n(k). Notice, this is before any kind of low-pass filtering is performed. The left-hand plot shows the overall signal while the right-hand plot shows a magnified view of the small box marked on the left-hand plot. Evidently, the analog estimation signal n(k) includes a small amount of noise. The FFT (in dB) of the noise (the difference between the digital input signal d(k) and the appropriately scaled estimation signal n(k)) is shown in FIG. 19. It clearly shows that the system performs second-order shaping (40 dB per decade). The other trace in FIG. 19 shows the signal-band power in dB (relative to the power of a full-scale sinusoidal) as a function of the oversampling ratio. According to this simulation, the system facilitates 16 bit D/A conversion at about 10 times oversampling. At this point of our technological evolution, this is outstanding performance.

A Fifth Embodiment

The switched-capacitor circuit technique offers high accuracy; in particular, it facilitates implementation of filters with accurately defined transfer functions. As exemplified by the third and fourth embodiments, high-performance D/A converter systems according to this invention can easily be implemented using this circuit technique.

The invention can, however, also be utilized in other environments. Other physical systems (not necessarily electrical) may also offer reasonably well-defined filter functions and they will thereby also be suitable as a system platform.

A fifth embodiment which will be described in the following will illustrate that analog filters are not at all a necessity in order to make use of this invention. More precisely, a mismatch-shaping D/A converter system that generates the output by simply adding elements will be described. The elements do not have the same size The fifth embodiment can therefore truthfully be described as a scaled-element mismatch-shaping D/A converter system. Since it may be used for numerous applications, not only in integrated circuits, it is a very important embodiment.

Description of the Fifth Embodiment

Figure 20:
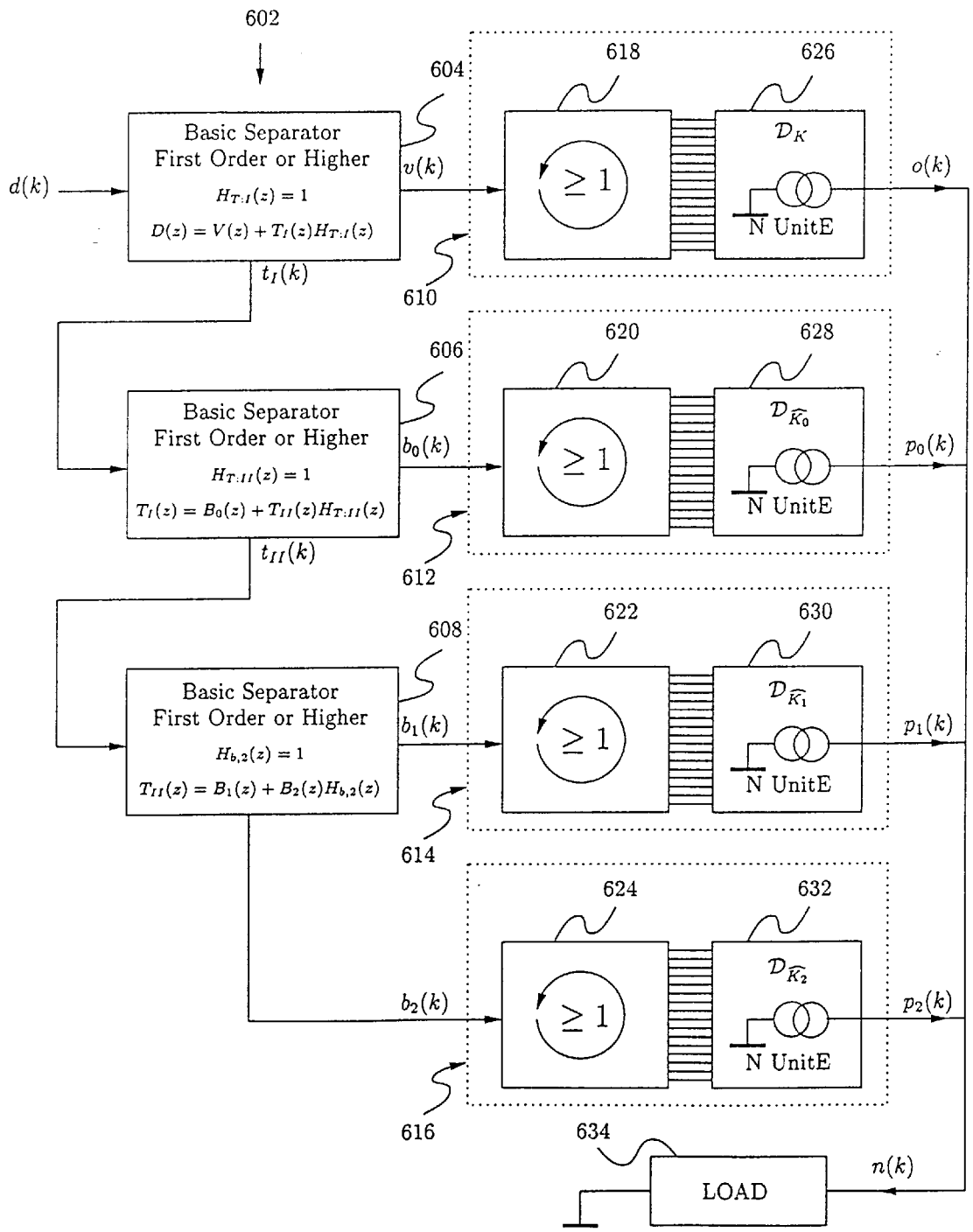
FIG. 20 shows how the fifth embodiment is implemented.

FIG. 20 shows the fifth embodiment. A separator [602], realized as a chain of basic separators [604] [606] [608], separates the digital input signal d(k) into a main digital signal v(k) and three digital compensation signals $b_0(k)$, $b_1(k)$, $b_2(k)$. The separator [602] may consist of any number of sub-separators [604] [606] [608]; FIG. 20 shows three sub-separators as an example.

A first sub-separation is performed by the first sub-separator [604]. It separates the input d(k) into the main signal v(k) and a first temporary signal $t_I(k)$. A second sub-separation is performed by the second sub-separator [606]. It separates the first temporary signal $t_I(k)$ into the first compensation signal $b_0(k)$ and a second temporary signal $t_{II}(k)$. A third, and in this case final sub-separation, is performed by the third sub-separator [608]. It separates the second temporary signal $t_{II}(k)$ into the second compensation signal $b_1(k)$ and the third compensation signal $b_2(k)$.

Sub-Separators

The sub-separators [604] [606] [608] are in this embodiment basic separators [202] of at least first order and implemented according to the general topology shown in FIG. 11. The quantizers [242] are multibit devices, in this embodiment 4 bits are assumed. The output from the sub-separators' [604] [606] [608] quantizers [242] form the system's main digital signal v(k) and the first and second digital compensation signals $b_0(k)$ and $b_1(k)$, respectively. The output from the sub-separators' [604] [606] [608] subtractors [230] provide the temporary signals $t_l(k)$, $t_H(k)$, and the third digital compensation signal $b_2(k)$, respectively.

D/A Converters

The four digital signals v(k), $b_0(k)$, $b_1(k)$, $b_2(k)$, into which the digital input signal d(k) has been separated, are individually D/A converted by mismatch-shaping D/A converters [610] [612] [614] [616]. The output currents from these D/A converters are connected to a single node, which is driving a load [634].

According to the prior art, the mismatch-shaping D/A converters [610] [612] [614] [616] can be realized as mismatch-shaping coders [618] [620] [622] [624] driving arrays of each supposedly identical current sources [626] [628] [630] [632].

Operation of the Fifth Embodiment

Each sub-separator [604] [606] [608] performs a separation whereby the sum of the two output signals equals the input. The overall separation will therefore fulfill Equation 22:

$$d(k)=v(k)+b_0(k)+b_1(k)+b_2(k) \tag{22}$$

By implementing the D/A converters [610] [612] [614] [616] with the same gain factor, the sum n(k) of their output currents o(k), $p_0(k)$, $p_1(k)$, $p_2(k)$ will be an analog replica of the digital input signal d(k) with the same gain factor.

Because the basic separators [604] [608] [608] are based on multi-level quantizers [242], the signal levels of v(k), $b_0(k)$, $b_1(k)$, $b_2(k)$ will decrease (in this order). When using four-bit quantizers [242], the signal levels will decrease by about three bits per stage. The ratio of the largest [626] and the smallest [632] current source will therefore be in the order of 500. Consequently, the system is a scaled-element D/A converter.

If the sub-separators [604] [606] [608] are of order higher than one, simulations show that the quantizers [242] should be designed with slightly more than $2^4$=16 levels; 20 levels is typically a good choice. The respective D/A converters [610] [612] [614] [816] will only have to implement those values which occur.

Non-Linearity Errors

Looking back on Equation 5, the following expression for non-linearity errors is recalled $$S(z)\hat{H}_V(z) + \sum_{i=0}^{N} M_i(z)\hat{H}_{B;i}(z)$$

Since the fifth embodiment does not make use of analog filters, the non-linearity error will simply be the sum of non-linearity errors from each of the D/A converters [610] [612] [614] [616]:

$$S(z) + \sum_{i=0}^{N} M_i(z).$$

The mismatch-shaping coders [618] [620] [622] [624] in each D/A converter [610] [612] [614] [616] must, therefore, provide the same order of mismatch-shaping as the overall system.

Gain-Mismatch Errors

Looking back on Equation 5, the following expression for gain-mismatch errors is recalled:

$$\sum_{i=0}^{N} B_i(z)\left[\hat{K}_i H_{B;i}^f(z) - K H_{B;i}(z)\right]$$

Since the fifth embodiment does not make use of analog filters, the gain-mismatch errors will simply be the compensation signals $b_0(k)$, $b_1(k)$, $b_2(k)$ suppressed by the relative gain-mismatch of the D/A converters [610] [612] [614] [616]:

$$\sum_{i=0}^{N} B_i(z)\left[\hat{K}_i - K\right].$$

To obtain a certain order of gain-mismatch error shaping, each of the compensation signals $b_0(k)$, $b_1(k)$, $b_2(k)$ must have this order of shaping.

The Compensation Signals are Shaped

Each sub-separator [604] [606] [608] is a basic separator [202] of first or higher order. The operation of the basic separator [202], FIG. 11, has been discussed above. It has been argued that the shaping of the signal from the subtractor [230] will have the same order of shaping as the order (i.e., the number of filter stages [232] [234] [236] [238]) of the basic separator [202]. Consequently, the temporary signals $t_l(k)$, $t_H(k)$ and the third compensation signal $b_2(k)$ will be at least first-order shaped. Because the first digital compensation signal $b_0(k)$ is the difference between the two temporary signals $t_l(k)$, $t_H(k)$, which are both at least first-order shaped, it follows that the first compensation signal $b_0(k)$ will be at least first-order shaped as well. A similar argument will show that also the second compensation signal $b_1(k)$ will be at least first-order shaped.

Optimizing the Embodiment

Those skilled in the art will be able to optimize the system to meet specific needs. The following will give some guidelines.

Non-Linearity Errors

To obtain a D/A converter with second- or higher-order shaping, each of the D/A converters [610] [612] [614] [616] will have to provide this order of shaping. High-order mismatch-shaping coders [618] [620] [622] [624] are known, but they are typically quite complex to implement. Accordingly, it is preferable to use first-order mismatch-shaping coders [618] [620] [622] [624], which are quite simple to implement.

The designer should understand that the order of shaping, along with the system's oversampling ratio, expresses a certain factor of suppression of errors in the signal band. The suppression can be estimated on the basis of FIG. 6. It is, however, additional suppression, and only in the signal band. The main suppression comes from plain matching, causing the Nyquist-band non-linearity errors to be fairly small themselves (for example 60 dB below full-scale of the respective D/A converters [618] [620] [622] [624]).

Example

Consider the design of a system with a 100 dB signal-to-noise ratio operating at 10 times oversampling. If a first-order mismatch-shaping coder [618] is used in the main D/A converter [610], then the array of current sources [626] must match with a relative accuracy of 25 dB–100 dB=–75 dB. This kind of matching is better than what can be expected from a standard technology. A –75 dB relative accuracy is, however, fairly simple to obtain if postprocessing, at-power-up, or background calibration is performed. The calibration complexity should be compared to the complexity of the alternative—to implement a second-order mismatch-shaping coder [618], which will offer an extra 10 dB of suppression. The second-most-significant D/A converter [612] has a full-scale output, which is 3 bits, 18 dB, lower than the main D/A converter [610]. Consequently, the respective mismatch-shaping coder [620] will only have to be first-order-shaping. The current sources [628] will not require calibration if a relative accuracy in the order of −60 dB can be expected. Accordingly, it will become clear that the least significant D/A converter [616] will not have to provide mismatch-shaping at all. It can be implemented as a scaled element D/A converter [616], and the coder [624] can be omitted.

Gain-Mismatch Errors

Unit elements will typically match the unity ratio better than scaled elements will match their intended ratios. Accordingly, the Nyquist-band power of the gain-mismatch errors can be expected to be larger than the Nyquist-band power of the non-linearity errors. Consequently, in an optimum design, the gain-mismatch errors will require more shaping than the non-linearity errors. This is even more so if the current sources [828] [628] [630] [632] are calibrated only within each array. Fortunately, this shaping strategy can easily be implemented.

Gain-mismatch errors are shaped to the same order as the compensation signals $b_0(k)$, $b_1(k)$, $b_2(k)$. Since it is quite easy to obtain high-order shaped compensation signals, gain-mismatch errors can easily be made both second- and third-order shaped. Therefore, in most cases, it will only be necessary to calibrate the current sources [626] [628] [830] [632] within each D/A converter [610] [612] [614] [616].

For example, assume that the first sub-separator [604] is designed as a second-order basic separator [202]. The second sub-separator [606] can then be designed as a first-order basic separator [202]. The power of the first-order shaped part of the first compensation signal $b_0(k)$ is proportional to the power of the second temporary signal $t_{II}(k)$ and therefore in general unimportant. The third sub-separator [608] operates at a quite low magnitude level, so it may be designed as a simple separator (splitting in most and least significant bits).

Non-Subtractive Sources

It is trivial to design a unit-element current-source D/A converter with a range which is symmetrical with respect to zero. Current sources are merely an example of an analog variable which the fifth embodiment can control. If another analog variable is used, it may, however, not be possible to generate negative values. For example, if the sources [626] [628] [630] [632] are light sources, how do you generate a negative light intensity?

High-power applications is another example of a non-subtractive environment. It is possible to implement a unit-element current-source D/A converter which can generate negative currents, but if the currents are large, it is a waste of energy. In this case it is important that all the power delivered from the sources [626] [628] [630] [632] is transferred to the load [634].

There are many ways to design a separator [602] which do not require subtraction in the analog domain. It is essentially a matter of redesigning the controllers [240] used in the basic separators [202].

The following is an easy way to think of the problem. The range of the first temporary signal $t_i(k)$ can be shifted to any offset by adding constant value to it. This is an allowable operation if the same value is subtracted from the main signal $v(k)$. By repeated use of this strategy, it is possible to make the main digital signal $v(k)$ and the digital compensation signals $b_0(k)$, $b_1(k)$, $b_2(k)$ non-negative.

Other Embodiments (Variations)

It will be impossible to describe all possible, yet useful, variations. This section will mention some of the more relevant, but it should not be construed as an exhaustive list of options.

The previous discussion has focussed on optimizing the D/A converter structure to yield very high performance using only very simple circuits. In some cases, however, the designer may want an even simpler mismatch-shaping D/A converter. This goal can actually be fulfilled by designing the D/A converter according to this invention. It will be assumed that first-order mismatch-shaping is sufficient, i.e., that an oversampling ratio of 30 or higher is permissible. The advantage of the D/A converters to be described is that the resolution is significantly higher than what can be obtained with first-order mismatch-shaping unit element D/A converters of reasonable complexity. As a consequence, they do not have to be used in combination with a multibit delta-sigma modulator, and the analog output filter [114] can be very simple, if not omitted.

Simple Switched-Capacitor D/A Converters

The described third embodiment was structurally very simple; its disadvantage was that the compensation signals were fairly large. When first-order mismatch-shaping is sufficient, it may, however, be a good design approach. Two examples are given below.

A First Variation

Design the first sub-separator [404] in FIG. 13 as the first sub-separator [504] in FIG. 15. In other words, let $H_T(z) = (1 - z^{-1})$, and let the main digital signal $v(k)$ be a binary signal. The array of digital filters [408] is omitted. Let $v(k)$ drive a binary D/A converter similar to the main D/A converter [566] in FIG. 17, and let each of the compensation signals $b_0(k)$, $b_1(k)$, $b_2(k)$, ..., $b_P(k)$ drive one capacitor in a capacitor array similar to the capacitor array [568] in FIG. 17. The elements [570] [572] [574] [576] in FIG. 17 are omitted, but the opamp [562] and the feedback element [564] should be included to provide the charge-to-voltage conversion.

The resulting system is equivalent to the first embodiment shown in FIG. 10.

A Second Variation

A better, but also slightly more complex, way to implement a first-order mismatch-shaping D/A converter will now be described. If the quantizer [242] in the basic separator [202], FIG. 11, implementing the first sub-separator [404] in the third embodiment, FIG. 13, is a multi-bit device, say 3 bits, the compensation signals $b_0(k)$, $b_1(k)$, $b_2(k)$, ..., $b_P(k)$ will be approximately 8 times smaller. Besides this change, the separator used in this embodiment is identical to the separator [402] used in the third embodiment. The main digital signal $v(k)$ is D/A converted by an at-least-first-order mismatch-shaping D/A converter. The compensation signals are D/A converted by a circuit similar to elements [570] and [574] in FIG. 17.

The errors from the compensation signals are all second-order shaped, so they are efficiently suppressed in the signal band—even if the capacitors [570] do not match very well. The error from the main D/A converter is only first-order shaped (unless a second-order mismatch-shaping coder is used). However, because it is possible to match the 8 large capacitors in the main D/A converter quite accurately, this error will be relatively small. This D/A converter system therefore offers a good compromise between simplicity and performance.

The compensations signals' gain-mismatch errors are expected to dominate their non-linearity errors. Accordingly, the DWA-coders [574] may be replaced by the slightly simpler thermometer coders.

A Simple Current-Source D/A Converter

The fifth embodiment may seem as a somewhat complicated circuit to implement. The complexity is due to its generic structure and high performance. A first-order mismatch-shaping current-source D/A converter can actually be implemented simpler.

Consider FIG. 16 where the first [504] and second [506] sub-separators are omitted. Let $t_I(k)$ be the digital input signal, let $b_6(k)$ be the main digital signal, and let $b_1(k)$, $b2(k)$, ..., $b_5(k)$ be the digital compensation signals. The main digital signal $b_6(k)$ and the digital compensation signals $b_1(k), b_2(k), \ldots, b_5(k)$ are individually D/A converted by first-order mismatch-shaping D/A converters, and the analog signals are added in the analog domain to form the analog output signal.

It has been shown that the sum of $b_1(k), b_2(k), \ldots, b_6(k)$ equals $t_I(k)$, so the separator functions as required. The array of digital filters [512] assures that each of the digital compensation signals is first-order shaped. Accordingly, the analog output signal will represent the digital input signal $t_n(k)$ and only include first-order shaped errors.

Tonal behavior is to be expected unless the digital input signal is busy. It can be avoided by dithering the quantizer [552] (i.e. adding a random noise signal). This is a well-known technique, frequently used in delta-sigma modulator design, which may be employed in all the described embodiments if required. It is, however, not likely to be required for simple separators of order higher than one. At any rate, because tonal phenomena in the main digital signal are compensated for by the compensation signals, tonal problems, in D/A converters according to this invention, are much less pronounced than they are in delta-sigma modulators.

SUMMARY, RAMIFICATION, AND SCOPE OF THE INVENTION

Those skilled in the art will understand that this invention is not exclusively described by the presented embodiments. The described new way to think of error-shaped D/A conversion can be used to implement error-shaping D/A converters of many varieties. The first embodiment illustrated a highly improved version of the dual-quantization D/A converter described in the prior art. The advantages of the first embodiment include its simpler structure and higher performance. Even better topologies were illustrated by the second, third, fourth, and fifth embodiment.

Integrated Circuits

The third embodiment and its superior equivalent, the fourth embodiment, illustrated how simply extremely well-performing D/A converters can be implemented in a mainstream VLSI technology. The high performance, obtained at a very low oversampling ratio, makes it applicable for applications where error-shaped D/A conversion has not been an option so far.

At the other end of the scale, a low oversampling ratio will decrease the power consumption of the overall system. For instance, when used in hearing aids or portable compact disc playback units, the lifetime of the battery can be extended significantly.

Audio Equipment

For audio and other equipment, the D/A converter systems are comparable to scaled-element D/A converters which do not produce distortion. What used to be distortion has now moved to frequencies where signals are undetectable by the human ear. This implies that there may not be a need for an analog post-filter to remove the remaining small errors; audio speakers, and the human ear in particular, will maintain this function. Due to the high resolution of these D/A converters, the transmitted high-frequency energy is so small that it is not likely to damage the human ear.

Resolution

The main problem of the prior art is the low resolution that mismatch-shaping D/A converters are restricted to. The reader may have realized that the fifth embodiment solves this problem once and for all. In the fifth embodiment, the magnitude of the compensation signals will drop by a certain factor for each sub-separator. This implies that the complexity of the algorithm is proportional to the resolution measured in bits. The prior art, in the best case, has a complexity which is exponentially related to the same measure. For high-resolution D/A converters this will result in a tremendous reduction of complexity.

If a simple high-order unit-element mismatch-shaping coder is invented, then the fifth embodiment will offer a scaled-element mismatch-shaping coder of the same order. In other words, the invention will keep pace with the evolution.

Concerning the Presented Theory

Many theoretical arguments of why and how this concept works have been given in parallel with the description of the embodiments. It is a new concept, and, consequently, the theory has not matured yet scope of this patent is, therefore, not to depend on the correctness of the presented theory in part or as a whole. It has been included to teach the invention in what is thought to be the best possible way, and to enable designers to make full use of invention in the future.

Scope

The discussion has focussed on the base band as the signal band. With the presented theory in hand, those skilled in the art will be able to design and implement error-shaping band-pass D/A converters as well. Also, it should be clear that, although the embodiments have been described as single-ended circuits, fully differential versions may be implemented as well.

It is to be understood that D/A converter systems according to this invention can be used as a feedback element in many types of analog-to-digital converters, including—in particular—balanced-force sensor systems wherein this invention offers an ideal way to cope with non-linearities.

Although the description contains many details and specifications, these should not be construed as limiting the scope of the invention, but as merely providing illustrations of some of the preferred embodiments of this invention. Other preferred embodiments include: motor-control; a loud speaker with a scaled array of coils, each coil being applied to one of two voltages (the truly digital loud speaker); or a set of scaled-torque motors working on the same shaft, etc. Surely many applications will also be found in the optical field as well.

Thus, the scope of the invention should be determined by the appended claims and their legal equivalents, rather than by the examples given.

I claim:

1. A digital-to-analog converter system, receiving a multi-bit digital input signal and providing an analog output signal comprising:

a separator separating said multi-bit digital input signal into a main digital signal and at least one first digital compensation signal;

a main digital-to-analog converter receiving said main digital signal and providing a main analog signal;

41 a mismatch-shaping digital-to-analog converter, receiving said first digital compensation signal and providing a first analog compensation signal, said mismatch-shaping digital-to-analog converter including a digital state machine that is updated as a function of said first digital compensation signal;

an analog adder, summing said main analog signal and said first analog compensation signal;

whereby, the analog output signal from the analog adder is an analog representation of the multi-bit digital input signal.

2. The digital-to-analog converter system of claim 1 wherein said first digital compensation signal is shaped to have less power density in the digital-to-analog converter system's signal band than the first digital compensation signal's average power density in the Nyquist band.

3. The digital-to-analog converter system of claim 2 wherein the shaping of said first digital compensation signal is of higher order than the shaping provided by said mismatch-shaping digital-to-analog converter.

4. The digital-to-analog converter system of claim 2 wherein said separator includes a first sub-separator comprising:

a first digital subtractor, receiving said multi-bit digital input signal and said main digital signal, and providing a first-first digital signal;

a first digital loop filter receiving said first-first digital signal, and providing a first-second digital signal;

a first controller, providing said main digital signal, and assuring that the first-second digital signal remains bounded.

5. The digital-to-analog converter system of claim 4 wherein said separator further includes a second sub-separator receiving said first-first digital signal and providing at least said first digital compensation signal.

6. The digital-to-analog converter system of claim 5 wherein said second sub-separator comprises:

a second digital subtractor, receiving said first-first digital signal and said first digital compensation signal, and providing a second-first digital signal;

a second digital loop filter receiving said second-first digital signal, and providing a second-second digital signal;

a second controller, providing said first digital compensation signal, and assuring that the second-second digital signal remains bounded.

7. The digital-to-analog converter system of claim 6 wherein said separator further includes a third sub-separator receiving said second-first digital signal and providing at least one second digital compensation signal.

8. The digital-to-analog converter system of claim 6 wherein said separator further includes a third sub-separator receiving said second-second digital signal and providing at least one second digital compensation signal.

9. The digital-to-analog converter system of claim 4 wherein said separator further includes a second sub-separator receiving said first-second digital signal and providing at least said first digital compensation signal.

10. The digital-to-analog converter system of claim 9 wherein said second sub-separator comprises a digital filter, receiving a part of said first-second digital signal, and producing said first digital compensation signal.

11. The digital-to-analog converter system of claim 9 wherein:

said first sub-separator further includes a first-second loop filter receiving a part of said first-second digital signal and providing a first-third digital signal;

42 said first controller assuring that said first-third digital signal remains bounded.

12. The digital-to-analog converter system of claim 9 wherein said second sub-separator comprises:

a first separator, receiving said first-second digital signal, and providing at least one temporary signal;

a second separator separating said temporary signal bit-wise.

13. The digital-to-analog converter system of claim 12 wherein said second sub-separator further comprises:

an array of digital filters, receiving the signals provided by said second separator, and providing at least one second digital compensation signal.

14. The digital-to-analog converter system of claim 4 further including an analog filter, coupled between said mismatch-shaping digital-to-analog converter and said analog adder.

15. The digital-to-analog converter system of claim 4 wherein a linear combination of at least two digital compensation signals, each filtered by a number of first-order difference filters, forms a signal for which the correlation function with respect to the first-first digital signal has a numerical maximum which exceeds 0.8.

16. The digital-to-analog converter system of claim 1 wherein said main digital-to-analog converter is a mismatch-shaping converter.

17. The digital-to-analog converter of claim 1 wherein said main digital-to-analog converter is a single-bit converter.

18. The digital-to-analog converter system of claim 1 wherein said separator comprises:

a first sub-separator, receiving said multi-bit digital input signal and providing said main digital signal and at least one temporary digital signal;

a digital filter receiving said temporary digital signal and providing said first digital compensation signal; said digital filter suppressing the digital-to-analog converter system's signal band.

19. A digital-to-analog converter system, receiving a multi-bit digital input signal and providing an analog output signal comprising:

a digital subtractor, receiving said multi-bit digital input signal and a main digital signal, and providing a first digital signal;

a first loop filter receiving a part of said first digital signal and providing a second digital signal;

a controller providing said main digital signal; said controller assuring that said second digital signal remains bounded; said main digital signal being a function of at least one signal other than said second digital signal;

a main digital-to-analog converter, receiving said main digital signal, and providing a main analog signal;

a filtering digital-to-analog converter, receiving a part of said second digital signal and providing an analog compensation signal; said filtering digital-to-analog converter having a frequency-dependent gain;

an analog adder, receiving said main analog signal and said analog compensation signal, and providing the analog output signal;

whereby the digital-to-analog converter system provides a digital-to-analog conversion.

20. The digital-to-analog converter system of claim 19 wherein said filtering digital-to-analog converter includes a filter function which is reciprocal to the filter function provided by the first loop filter.

21. The digital-to-analog converter system of claim 19 wherein said main digital-to-analog converter includes a delay.

22. The digital-to-analog converter system of claim 19 wherein said filtering digital-to-analog converter comprises:
   a separator, receiving said second digital signal, and providing at least one temporary digital signal;
   a cascade element, comprising a filter and a digital-to-analog converter; said cascade element receiving said temporary digital signal, and providing at least a part of said analog compensation signal.

23. The digital-to-analog converter system of claim 19 wherein said filtering digital-to-analog converter provides a frequency-dependent filter function in the analog domain.

24. The digital-to-analog converter system of claim 19 wherein said filtering digital-to-analog converter provides a frequency-dependent filter function in the digital domain.

25. The digital-to-analog converter system of claim 19 wherein said main digital-to-analog converter is a single-bit converter.

26. The digital-to-analog converter system of claim 19 wherein said main digital-to-analog converter is a mismatch-shaping converter.

27. The digital-to-analog converter system of claim 19 wherein said filtering digital-to-analog converter comprises a mismatch-shaping digital-to-analog converter.

28. A digital-to-analog converter system receiving a multi-bit digital input signal and providing an analog output signal comprising:
   a separator separating said multi-bit digital input signal into a main digital signal and at least two digital compensation signals;
   a main digital-to-analog converter receiving said main digital signal and providing a main analog signal;
   an array of digital-to-analog converters, receiving parts of said two digital compensation signals and providing two temporary analog signals;
   an array of analog filters receiving said two temporary analog signals and providing two analog compensation signals;
   an analog adder summing said main analog signal and at least said two analog compensation signals;
   whereby the digital-to-analog converter provides a digital-to-analog conversion.

29. The digital-to-analog converter system of claim 28 wherein at least one digital-to-analog converter in said array of digital-to-analog converters is a mismatch-shaping converter.

30. The digital-to-analog converter system of claim 28 wherein at least one filter in said array of analog filters has a frequency-dependent gain.

31. The digital-to-analog converter system of claim 28 wherein at least one filter in said array of analog filters is implemented as a switched-capacitor filter.

32. The digital-to-analog converter system of claim 28 wherein at least one filter in said array of analog filters is realized as a set of analog filters; the filters in said set of analog filters being applied to independently controlled analog sources in the respective digital-to-analog converter in said array of digital-to-analog converters.

33. The digital-to-analog converter system of claim 28 wherein at least one of the two digital compensation signals is shaped to have less power density in the digital-to-analog converter system's signal band than the compensation signal's average power density in the Nyquist band.

34. The digital-to-analog converter system of claim 28 wherein the main digital-to-analog converter is a mismatch-shaping converter.

35. A method for converting a multi-bit digital input signal to an analog output signal comprising the following steps:
   separating said multi-bit digital input signal into a main digital signal and at least one digital compensation signal,
   converting said main digital signal into a main analog signal,
   converting said digital compensation signal into an analog compensation signal using a mismatch-shaping digital-to-analog converter, said mismatch-shaping digital-to-analog converter including a digital state machine that is updated as a function of said digital compensation signal,
   adding said main analog signal and said analog compensation signal to generate the analog output signal.

36. The method of claim 35 wherein the separating step comprises separating the digital input signal into a single-bit main digital signal.

37. The method of claim 35 wherein the separating step comprises subtracting said main digital signal from said multi-bit digital input signal.

38. The method of claim 37 wherein the separating step further comprises:
   generating a temporary signal, and
   suppressing said temporary signal in the digital-to-analog converter system's signal band.

39. The method of claim 35 wherein the step of converting said main digital signal into said main analog signal comprises:
   coding said main digital signal by a mismatch-shaping coder to produce a first set of control signals,
   controlling an array of analog signal sources by said first set of control signals.

40. The method of claim 35 wherein the separating step comprises:
   separating said multi-bit digital input signal into said main digital signal and a plurality of lower-resolution digital compensation signals.

41. The method of claim 35 further including the step of.
   suppressing said analog compensation signal in the digital-to-analog converter system's signal band before it is added to said main analog signal.

\* \* \* \* \*